(12) United States Patent
Fujiwara et al.

(10) Patent No.: US 8,748,975 B2
(45) Date of Patent: Jun. 10, 2014

(54) SWITCHING ELEMENT AND MANUFACTURING METHOD THEREOF

(71) Applicants: Hirokazu Fujiwara, Miyoshi (JP);
Yukihiko Watanabe, Nagoya (JP);
Narumasa Soejima, Seto (JP);
Toshimasa Yamamoto, Ichinomiya (JP);
Yuichi Takeuchi, Obu (JP)

(72) Inventors: Hirokazu Fujiwara, Miyoshi (JP);
Yukihiko Watanabe, Nagoya (JP);
Narumasa Soejima, Seto (JP);
Toshimasa Yamamoto, Ichinomiya (JP);
Yuichi Takeuchi, Obu (JP)

(73) Assignees: Toyota Jidosha Kabushiki Kaisha, Toyota-Shi (JP); Denso Corporation, Kariya-Shi (JP)

( * ) Notice: Subject to any disclaimer, the term of this patent is extended or adjusted under 35 U.S.C. 154(b) by 0 days.

(21) Appl. No.: 13/712,343

(22) Filed: Dec. 12, 2012

(65) Prior Publication Data

US 2013/0146969 A1    Jun. 13, 2013

(30) Foreign Application Priority Data

Dec. 13, 2011 (JP) ................................. 2011-272075

(51) Int. Cl.
*H01L 29/66* (2006.01)
*H01L 21/336* (2006.01)

(52) U.S. Cl.
USPC ............ 257/330; 257/E29.257; 257/E21.629; 438/270

(58) Field of Classification Search
None
See application file for complete search history.

(56) References Cited

U.S. PATENT DOCUMENTS

2003/0213993 A1 * 11/2003 Spring et al. .................. 257/330

FOREIGN PATENT DOCUMENTS

| JP | 09-063968 A | 3/1997 |
|---|---|---|
| JP | 2001-077363 A | 3/2001 |
| JP | 2001-094120 A | 4/2001 |
| JP | 2005-005655 A | 1/2005 |
| JP | 2009-117593 A | 5/2009 |

* cited by examiner

*Primary Examiner* — Michael Lebentritt
*Assistant Examiner* — Kevin Quinto
(74) *Attorney, Agent, or Firm* — Kenyon & Kenyon, LLP

(57) ABSTRACT

A switching element is provided having a semiconductor substrate. A trench gate electrode is formed in the upper surface of the semiconductor substrate. An n-type first semiconductor region, a p-type second semiconductor region, and an n-type third semiconductor region are formed in a region in contact with a gate insulating film in the semiconductor substrate. At a position below the second semiconductor region, there is formed a p-type fourth semiconductor region connected to the second semiconductor region and opposing the gate insulating film via the third semiconductor region and containing boron. A high-concentration-carbon containing region having a carbon concentration higher than that of a semiconductor region exposed on the lower surface of the semiconductor substrate is formed in at least a part of the portion of the third semiconductor region, positioned between the fourth semiconductor region and the gate insulating film, that is in contact with the fourth semiconductor region.

9 Claims, 23 Drawing Sheets

F I G. 2
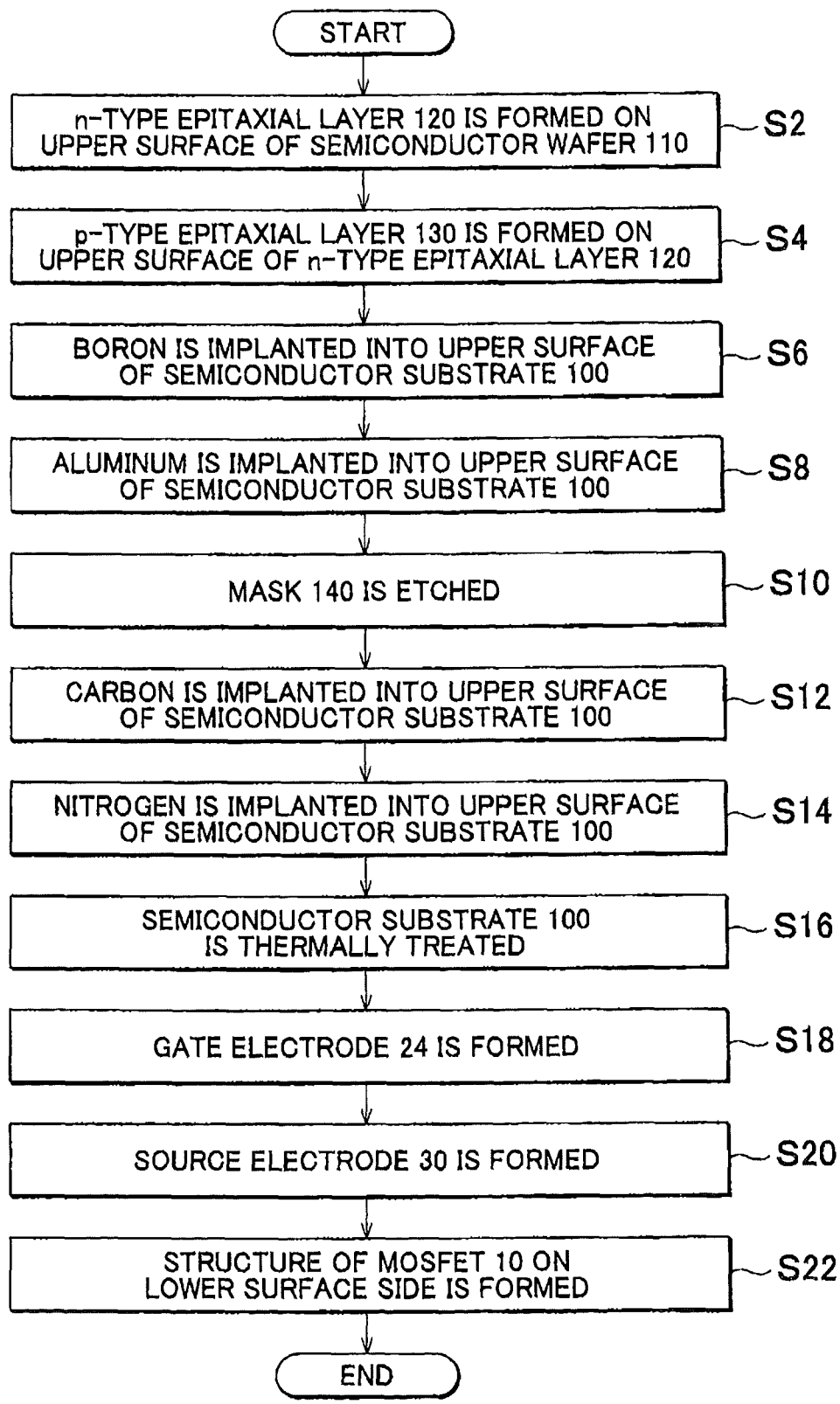

SWITCHING ELEMENT AND MANUFACTURING METHOD THEREOF

INCORPORATION BY REFERENCE

The disclosure of Japanese Patent Application No. 2011-272075 filed on Dec. 13, 2011 including the specification, drawings and abstract is incorporated herein by reference in its entirety.

BACKGROUND OF THE INVENTION

1. Field of the Invention

The invention relates to a switching element having a trench gate electrode and a manufacturing method thereof.

2. Description of Related Art Japanese Patent Application Publication No. 2009-117593 (JP-2009-117593 A) discloses a switching element having a trench gate electrode. In the switching element, an n-type source region, a p-type base region, and an n-type drift region are formed in a region in contact with a gate insulating film. In the switching element of this type, a high voltage tends to be applied to the gate insulating film at a portion interposed between the gate electrode and the drift region. Consequently, in the switching element, a p-type deep region is formed at a position below the base region that is not contact with the gate insulating film. When the high voltage is applied to the switching element, a depletion layer is formed to extend from the deep region toward the gate insulating film, and the application of a high electric field to the gate insulating film is thereby prevented.

The deep region of the switching element of JP-2009-117593 A is not a region where a main current flows. Therefore, when the deep region is formed in the switching element, there has been a concern that the switching element is increased in size though the value of a current that can be applied is not increased. Accordingly, the invention provides the switching element that is capable of preventing the application of the high electric field to the gate insulating film and is small in size, and a manufacturing method thereof.

SUMMARY OF THE INVENTION

A switching element according to a first aspect of the invention includes:

a semiconductor substrate; a gate insulating film covering an inner surface of a trench formed in an upper surface of the semiconductor substrate; a gate electrode disposed in an internal portion of the trench; an n-type first semiconductor region present in the semiconductor substrate and in contact with the gate insulating film on a side surface of the trench; a p-type second semiconductor region present in the semiconductor substrate and in contact with the gate insulating film on the side surface of the trench and formed below the first semiconductor region; an n-type conductivity third semiconductor region present in the semiconductor substrate and in contact with the gate insulating film on the side surface of the trench and formed below the second semiconductor region; a p-type fourth semiconductor region present in the semiconductor substrate and in contact with the second semiconductor region on a lower side of the second semiconductor region and opposing the gate insulating film via the third semiconductor region, this fourth semiconductor region containing boron; and a fifth semiconductor region present below the third semiconductor region in the semiconductor substrate and formed to be exposed on a lower surface of the semiconductor substrate; wherein at least a part of the third semiconductor region positioned between the fourth semiconductor region and the gate insulating film has a carbon concentration higher than that of the fifth semiconductor region.

According to the first aspect of the invention, it is possible to reduce the size of the switching element and prevent application of a high electric filed to the gate insulating film.

In the first aspect of the invention, the above switching element may also be formed with a high-concentration-carbon containing region below the fourth semiconductor region.

According to the above aspect, when boron is activated in the manufacturing steps of the switching element, it is possible to suppress downward diffusion of boron. With this, it becomes easy to form the shape of the fourth semiconductor region into an intended shape.

In addition, a manufacturing method of the above switching element according to a second aspect of the invention includes: a first step of implanting boron into a region where the fourth semiconductor region is to be formed in the semiconductor substrate; a second step of forming a region having the carbon concentration higher than that of the semiconductor substrate on or in the semiconductor substrate; a third step of heating the semiconductor substrate after execution of the first and second steps;

a fourth step of forming the trench; a fifth step of forming the gate insulating film; and a sixth step of forming the gate electrode.

Note that any one of the step of implanting boron and the step of forming the high-concentration-carbon containing region may be executed before execution of the other step. In addition, the steps of forming the trench, the gate insulating film, and the gate electrode may be executed in any order.

According to the second aspect of the invention, when boron is activated by the step of heating the semiconductor substrate, the diffusion of boron toward the gate insulating film is suppressed by the high-concentration-carbon containing region. Consequently, it is possible to reduce the size of the fourth semiconductor region and, as a result, it is possible to manufacture the small switching element.

In the second aspect of the invention, the step of forming the high-concentration-carbon containing region may be the step of implanting carbon into the semiconductor substrate.

With this, it is possible to form the high-concentration-carbon containing region in any region.

In addition, in the second aspect of the invention, boron may be implanted into the semiconductor substrate through a mask having an opening formed on a surface of the semiconductor substrate in the step of implanting boron, a step of enlarging the opening of the mask by etching may be executed after execution of the step of implanting boron, and carbon may be implanted into the semiconductor substrate through the mask having the enlarged opening in the step of implanting carbon.

With this, it is possible to execute the implantation of boron and the implantation of carbon with the same mask, and hence it is possible to efficiently manufacture the switching element.

Further, in the second aspect of the invention, a part of carbon implanted in the step of implanting carbon may be implanted into a position below the region where boron is implanted in the step of implanting boron.

With this, when boron is activated, it is possible to suppress diffusion of boron to a lower side. That is, it is possible to more precisely control the region for the fourth semiconductor region.

Furthermore, the second aspect of the invention may further include a step of implanting an n-type impurity into a region in the semiconductor substrate where the first semiconductor region is to be formed through a mask having an opening formed on a surface of the semiconductor substrate. In the step of implanting carbon, carbon may be implanted into the semiconductor substrate through the same mask as the mask used in the step of implanting the n-type impurity.

With this, the same mask can be used in the step of implanting the n-type impurity and the step of implanting carbon. That is, it is possible to efficiently manufacture the switching element.

Moreover, in the second aspect of the invention, the step of forming a region containing high-concentration carbon may be a step of forming a layer containing high-concentration carbon on the semiconductor substrate by epitaxial growth. In this case, in the step of implanting boron, boron may be implanted into the high-concentration-carbon containing layer.

With this, it is possible to form the small fourth semiconductor region.

In addition, in the second aspect of the invention, boron implanted in the step of implanting boron may be implanted into a position above the lower end of the layer containing high-concentration carbon.

According to the above configuration, when boron is activated, it is possible to suppress diffusion of boron to the lower side. With this, it is possible to more precisely control the region for the fourth semiconductor region.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein:

FIG. 2 is a flowchart showing manufacturing steps of the MOSFET of the first embodiment;

DETAILED DESCRIPTION OF EMBODIMENTS

Figure 1:
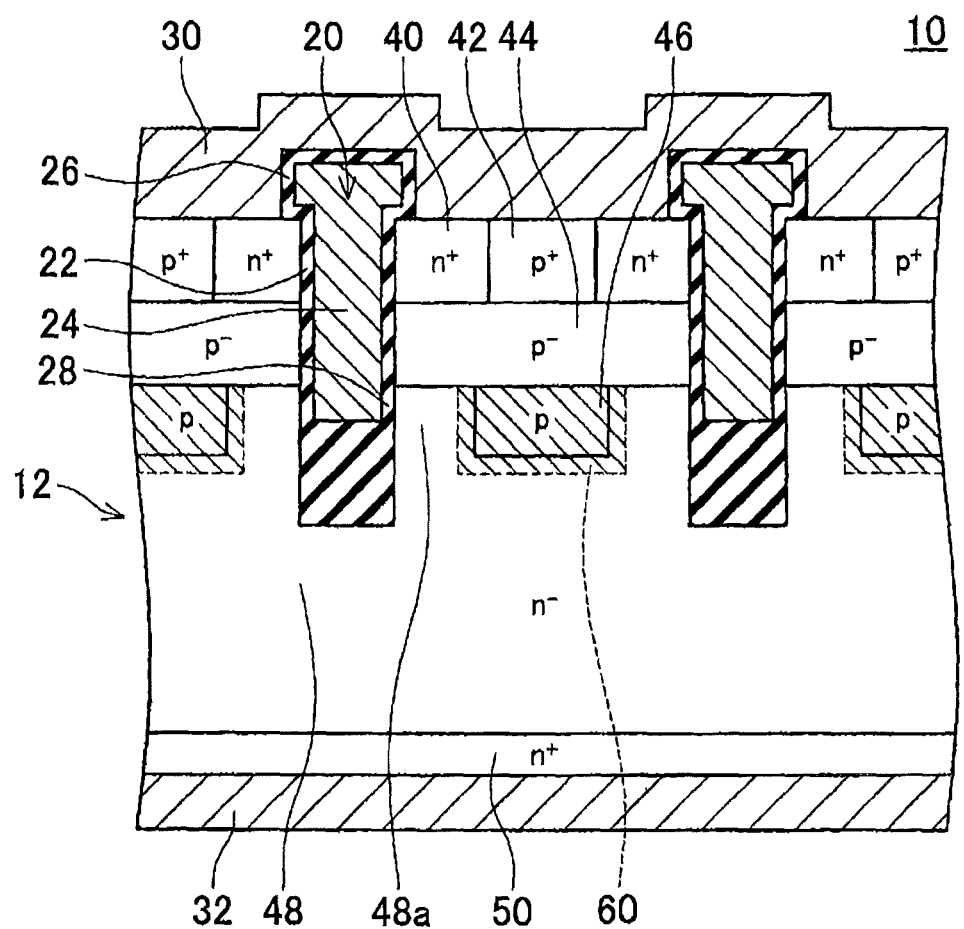
FIG. 1 is a longitudinal sectional view of a metal-oxide-semiconductor field-effect transistor (MOSFET) of a first embodiment.

As shown in FIG. 1, a MOSFET 10 manufactured by a manufacturing method of a first embodiment includes a semiconductor substrate 12 and electrodes and insulating films formed on the surface of the semiconductor substrate 12 and the like. The semiconductor substrate 12 is a silicon carbide (SiC) substrate.

A plurality of trenches 20 are formed in the upper surface of the semiconductor substrate 12. The inner surface of each trench 20 is covered with a gate insulating film 22. A gate electrode 24 is formed in each trench 20. The gate electrode 24 is insulated from the semiconductor substrate 12 by the gate insulating film 22. The gate insulating film 22 below the gate electrode 24 is formed to be thicker than the gate insulating film 22 on the side of the gate electrode 24. A part of the gate electrode 24 is positioned above the trench 20. The gate electrode 24 above the trench 20 is covered with an interlayer insulating film 26.

A source electrode 30 is formed on the upper surface of the semiconductor substrate 12. The source electrode 30 is insulated from the gate electrode 24 by the interlayer insulating film 26. A drain electrode 32 is formed on the lower surface of the semiconductor substrate 12.

In the internal portion of the semiconductor substrate 12, source regions 40, contact regions 42, base regions 44, deep regions 46, a drift region 48, and a drain region 50 are formed.

Each source region 40 is an n-type region. The source region 40 is formed in a region exposed on the upper surface of the semiconductor substrate 12. The source region 40 is in contact with the gate insulating film 22. The source region 40 is in ohmic contact with the source electrode 30.

Each contact region 42 is a p-type region. The contact region 42 is formed in a region (a region between the two source regions 40) exposed on the upper surface of the semiconductor substrate 12. The contact region 42 is in ohmic contact with the source electrode 30.

Each base region 44 is the p-type region connected to the contact region 42. The p-type impurity concentration of the base region 44 is lower than that of the contact region 42. The base region 44 is formed below the source region 40 and the contact region 42. The base region 44 is in contact with the gate insulating film 22 below the source region 40.

Each deep region 46 is the p-type region connected to the base region 44. The p-type impurity concentration of the deep region 46 is lower than that of the contact region 42. The deep region 46 is formed below the base region 44.

The drift region 48 is the n-type region. The n-type impurity concentration of the drift region 48 is lower than the n-type impurity concentration of the source region 40. The drift region 48 is formed below the base region 44 and the deep region 46. The drift region 48 is separated from the source region 40 by the base region 44. The drift region 48 is in contact with the gate insulating film 22 formed on the side surface of the trench 20 and the gate insulating film 22 formed at the bottom portion of the trench 20. A part of the drift region 48 is present between the deep region 46 and the gate insulating film 22. Consequently, the deep region 46 is not in contact with the gate insulating film 22 and opposes the gate insulating film 22 via the drift region 48. In the following description, the drift region 48 between the deep region 46 and the gate insulating film 22 is referred to as a separating drift region 48a.

The drain region 50 is the n-type region. The drain region 50 is formed below the drift region 48. The n-type impurity concentration of the drain region 50 is higher than that of the drift region 48. The drain region 50 is formed in a region exposed on the lower surface of the semiconductor substrate 12. The drain region 50 is in ohmic contact with the drain electrode 32.

In addition, each of semiconductor regions 60 indicated by hatching in FIG. 1 is a high-concentration-carbon containing region where a carbon concentration is high in the semiconductor substrate 12. The carbon concentration in the high-concentration-carbon containing region 60 is higher than that in the semiconductor substrate 12 outside the high-concentration-carbon containing region 60. That is, the carbon concentration in the high-concentration-carbon containing region 60 is higher than the carbon concentration in the drain region 50 exposed on the lower surface of the semiconductor, substrate 12. The high-concentration-carbon containing region 60 is formed to extend from the drift region 48 to the deep region 46, and the entire deep region 46 is included in the high-concentration-carbon containing region 60.

In the MOSFET 10, the deep region 46 formed below the base region 44 contains boron. Accordingly, the deep region 46 can be formed by implanting boron into the semiconductor substrate 12 and then activating boron. Boron can be implanted into the semiconductor substrate 12 at a low energy level, and hence it is possible to precisely control the region where boron is implanted. On the other hand, boron has a high diffusion coefficient in the semiconductor substrate 12. Consequently, when implanted boron is activated by means of a common method, boron is diffused in the semiconductor substrate 12, and the deep region 46 is increased in size. However, since the high-concentration-carbon containing region 60 having a high carbon concentration is formed in the separating drift region 48a positioned between the deep region 46 and the gate insulating film 22, the diffusion of boron is suppressed. As a result, it becomes possible to reduce the deep region 46 region so that it is possible to prevent the application of a high electric field to the gate insulating film 22, and also reduce the size of the MOSFET 10 itself.

Next, the operation of the MOSFET 10 will be described. When the MOSFET 10 is turned ON, a predetermined voltage is applied to the gate electrode 24 in a state where a forward voltage is applied between the source electrode 30 and the drain electrode 32. In response to this, a channel is formed in the portion of the base region 44 in contact with the gate insulating film 22. With this, electrons flow from the source electrode 30 to the drain electrode 32 through the source region 40, the channel, the drift region 48, and the drain region 50.

In addition, when the MOSFET 10 is OFF, a high electric field is generated in the semiconductor substrate 12. The high electric field tends to be applied particularly to the gate insulating film 22 in the vicinity of the bottom portion of the trench 20 (the portion of the gate insulating film 22 in contact with the drift region 48). However, when the MOSFET 10 is turned OFF, a depletion layer extends from the deep region 46 into the separating drift region 48a. By the depletion layer, the electric field applied to the gate insulating film 22 in a region 28 is relaxed. Accordingly, it is possible to improve withstand voltage performance by providing the deep region 46.

Next, a manufacturing method of the MOSFET 10 will be described. In the manufacturing method, the MOSFET 10 is manufactured from a semiconductor wafer (a semiconductor wafer 110 shown in FIG. 3) made of 4H—SiC. The semiconductor wafer 110 has an n-type conductivity, and has substantially the same n-type impurity concentration as that of the drain region 50. The MOSFET 10 is manufactured by steps shown in a flowchart of FIG. 2.

Figure 3:
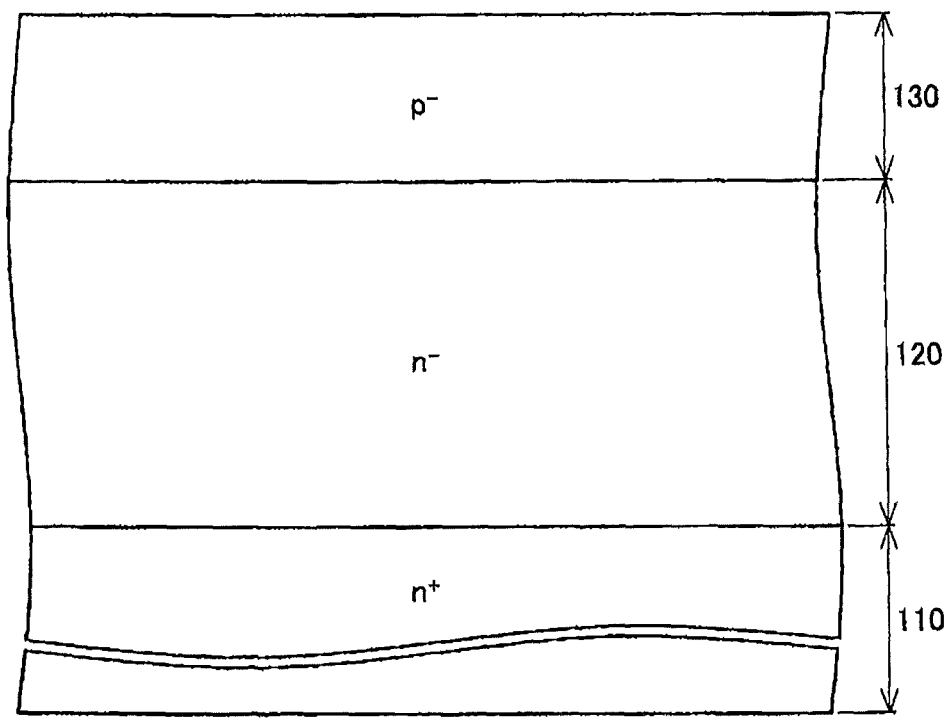
FIG. 3 is a longitudinal sectional view of a semiconductor substrate after execution of Step S4 of FIG. 2.

In Step S2, an n-type epitaxial layer 120 shown in FIG. 3 is grown on the upper surface of the semiconductor wafer 110. In this Step, the n-type epitaxial layer 120 having a thickness of about 13 μm and the n-type impurity at substantially the same concentration as that of the drift region 48 is grown.

In Step S4, a p-type epitaxial layer 130 shown in FIG. 3 is grown on the upper surface of the n-type epitaxial layer 120. In this Step, the p-type epitaxial layer 130 having a thickness of about 1.8 μm and the p-type impurity (aluminum) at substantially the same concentration as that of the base region 44 is grown. With this, as shown in FIG. 3, a semiconductor substrate 100 having three layers of the semiconductor wafer 110, the n-type epitaxial layer 120, and the p-type epitaxial layer 130 is obtained.

Figure 4:
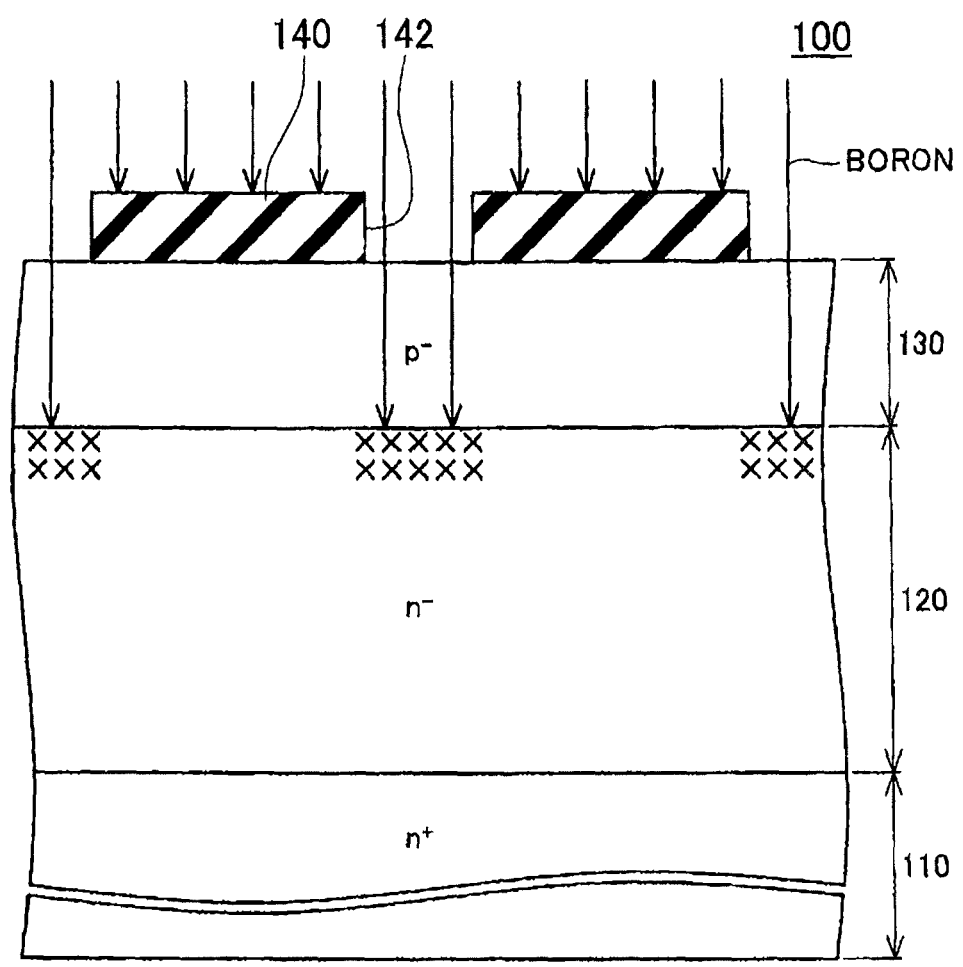
FIG. 4 is an explanatory view of boron implantation of Step S6 of FIG. 2.

In Step S6, as shown in FIG. 4, a mask 140 made of silicon oxide is formed on the upper surface of the semiconductor substrate 100. In this Step, the mask 140 is formed such that an opening 142 is positioned on a region where the contact region 42 is to be formed. When the mask 140 is formed, boron is applied to the upper surface of the semiconductor substrate 100. As a result, as shown in FIG. 4, boron is not implanted into the semiconductor substrate 100 in the region covered with the mask 140, but is implanted only into the semiconductor substrate 100 in the region formed with the opening 142. In this Step, boron is implanted such that boron having passed through the opening 142 is stopped in the n-type epitaxial layer 120 in the vicinity of the p-type epitaxial layer 130 (e.g., at a depth of about 2.2 μm from the upper surface of the semiconductor substrate 100). That is, boron is implanted into the region where the deep region 46 is to be formed.

Figure 5:
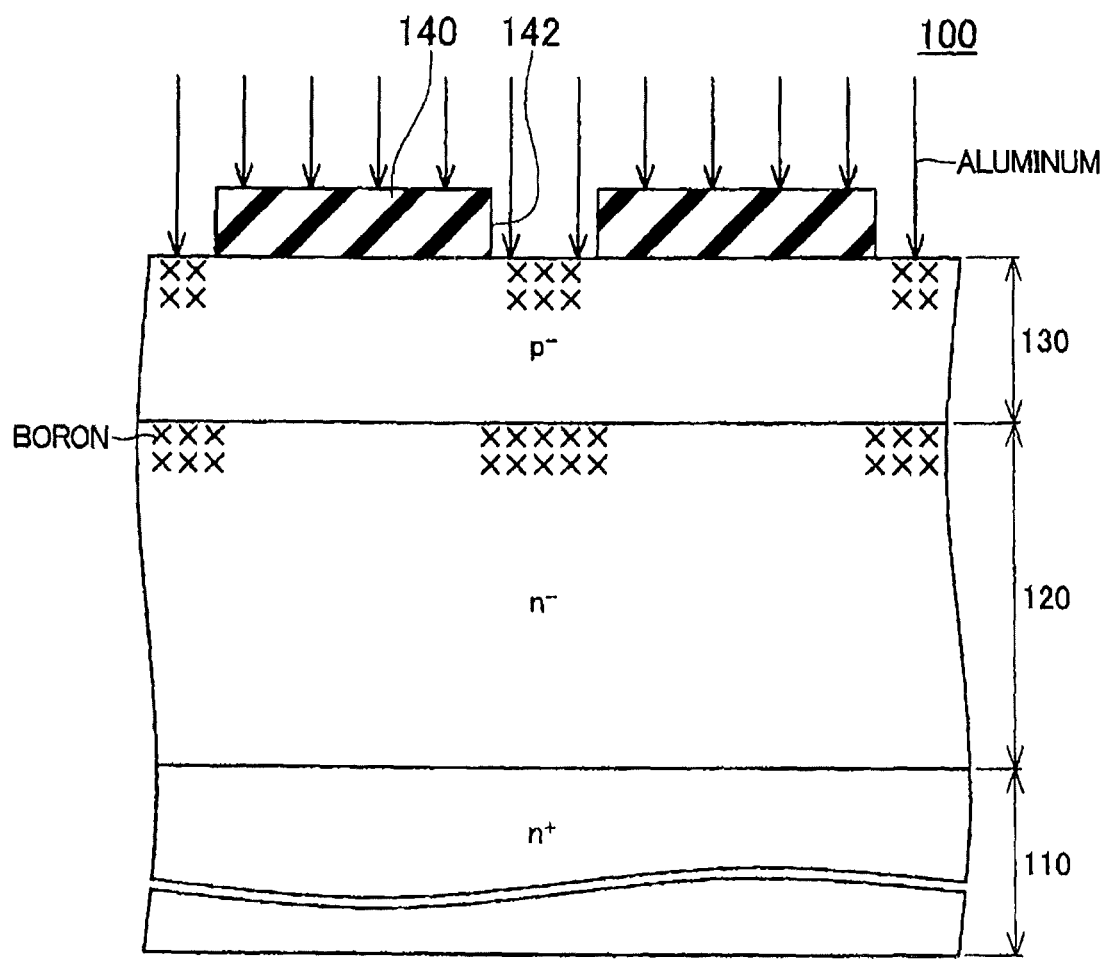
FIG. 5 is an explanatory view of aluminum implantation of Step S8 of FIG. 2.

In Step S8, aluminum is applied to the upper surface of the semiconductor substrate 100 in a state where the mask 140 (the mask used in Step S6) is present on the upper surface of the semiconductor substrate 100. As a result, as shown in FIG. 5, aluminum is not implanted into the semiconductor substrate 100 in the region covered with the mask 140, but is implanted only into the semiconductor substrate 100 in the region formed with the opening 142. In this Step, aluminum is implanted such that aluminum having passed through the opening 142 is stopped in the vicinity of the upper surface of the semiconductor substrate 100. That is, aluminum is implanted into the region where the contact region 42 is to be formed.

Figure 6:
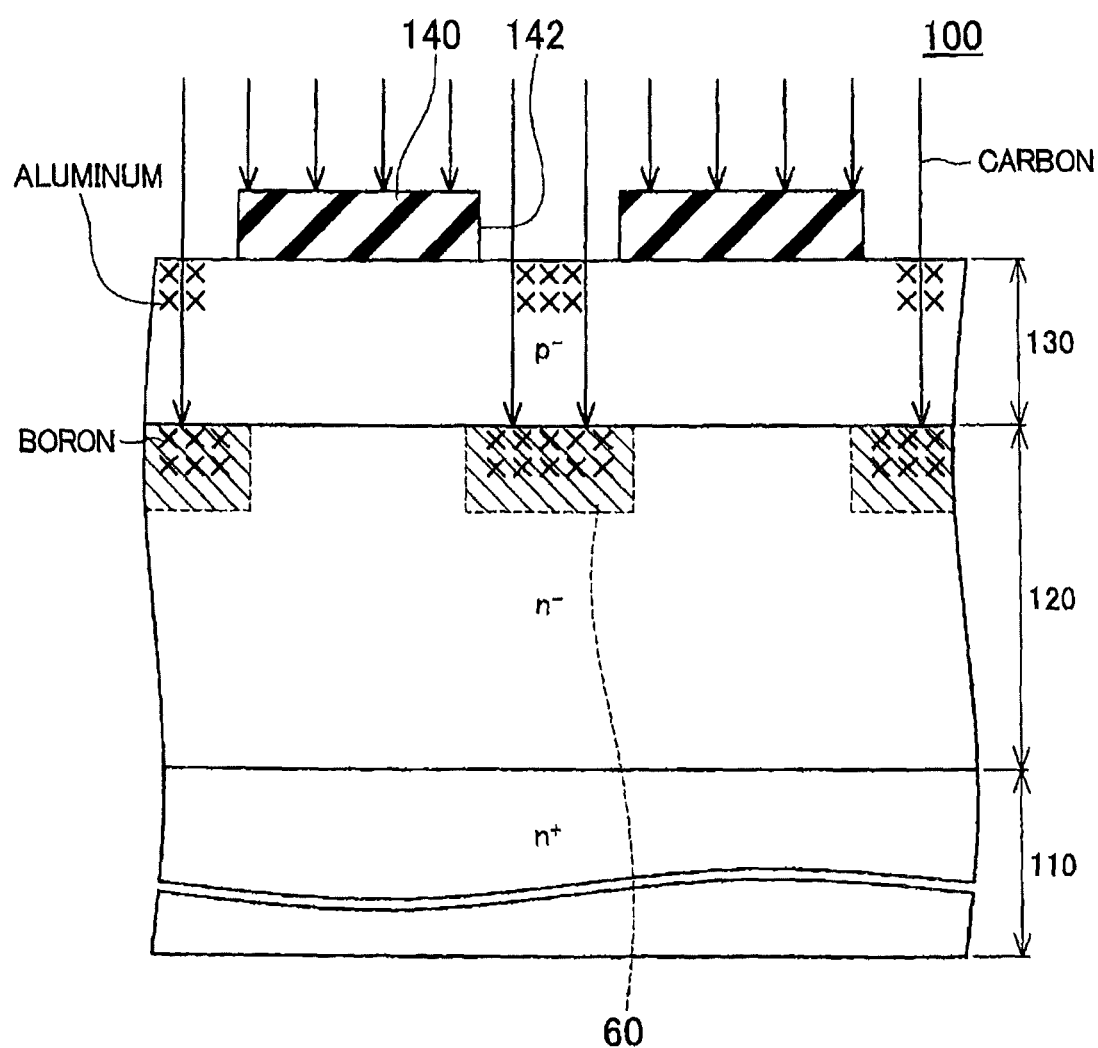
FIG. 6 is an explanatory view of carbon implantation of Step S12 of FIG. 2.

In Step S10, the mask 140 is etched by using hydrofluoric acid (HF). With this, as shown in FIG. 6, the opening 142 of the mask 140 is enlarged.

In Step S12, carbon is applied to the upper surface of the semiconductor substrate 100 through the mask 140. As a result, as shown in FIG. 6, carbon is not implanted into the semiconductor substrate 100 in the region covered with the mask 140, but is implanted only into the semiconductor substrate 100 in the region formed with the opening 142. With this, the high-concentration-carbon containing region 60 is formed in the semiconductor substrate 100. The opening 142 is enlarged to be larger than that in Step S6, and hence the width of the high-concentration-carbon containing region 60 in a lateral direction (a direction in parallel with the upper surface of the semiconductor substrate 100) is wider than the width of the region where boron is implanted in the lateral direction. In addition, in Step S12, the high-concentration-carbon containing region 60 is formed such that the width of the high-concentration-carbon containing region 60 in a depth direction becomes wider than the width of the region where boron is implanted in the depth direction.

Figure 7:
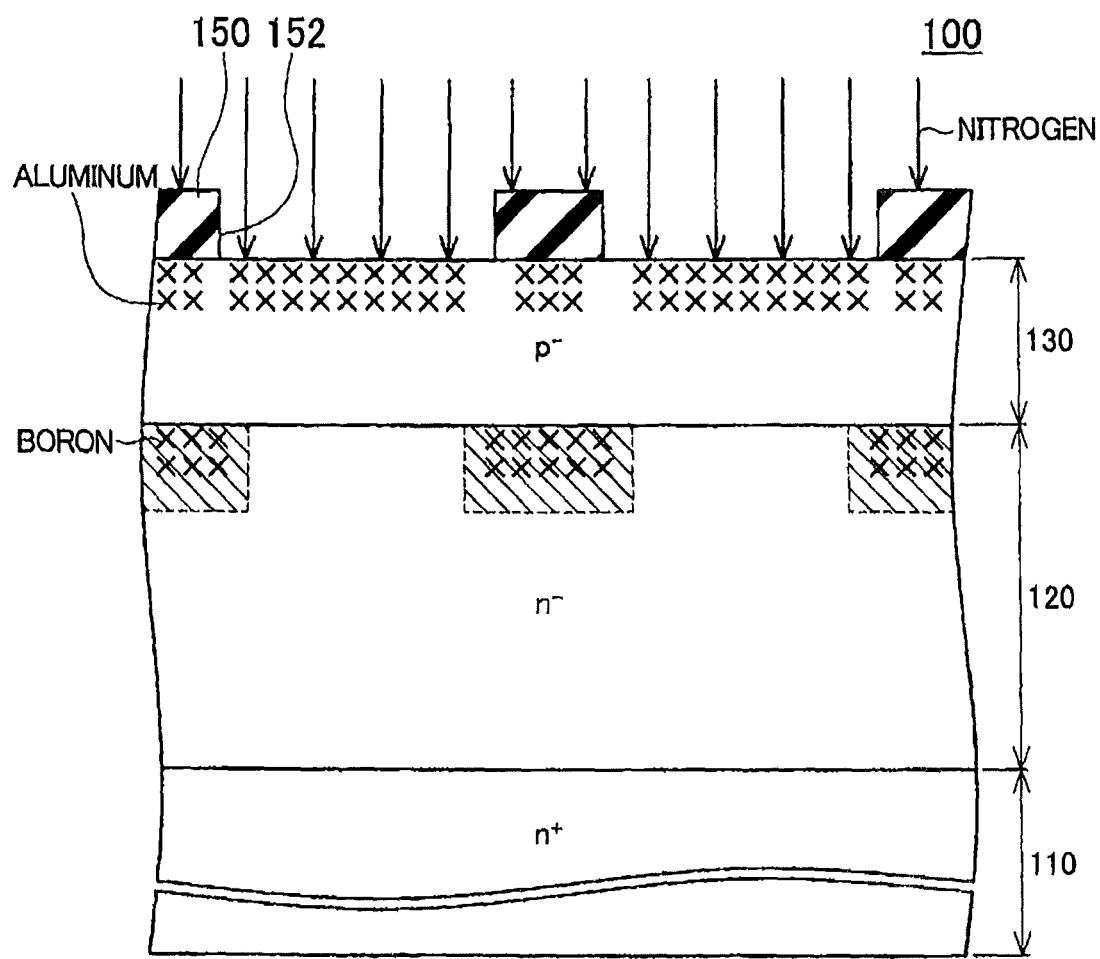
FIG. 7 is an explanatory view of nitrogen implantation of Step S14 of FIG. 2.

In Step S14, as shown in FIG. 7, a mask 150 is formed on the upper surface of the semiconductor substrate 100. In this Step, the mask 150 is formed such that an opening 152 is positioned on a region where the source region 40 is to be formed. When the mask 150 is formed, nitrogen is applied to the upper surface of the semiconductor substrate 100. As a result, nitrogen is not implanted into the semiconductor substrate 100 in the region covered with the mask 150, but is implanted only into the semiconductor substrate 100 in the region formed with the opening 152. In this Step, nitrogen is implanted such that nitrogen having passed through the opening 152 is stopped in the vicinity of the upper surface of the semiconductor substrate 100. That is, nitrogen is implanted into the region where the source region 40 is to be formed. After the end of Step S14, the mask 150 is removed.

Figure 8:
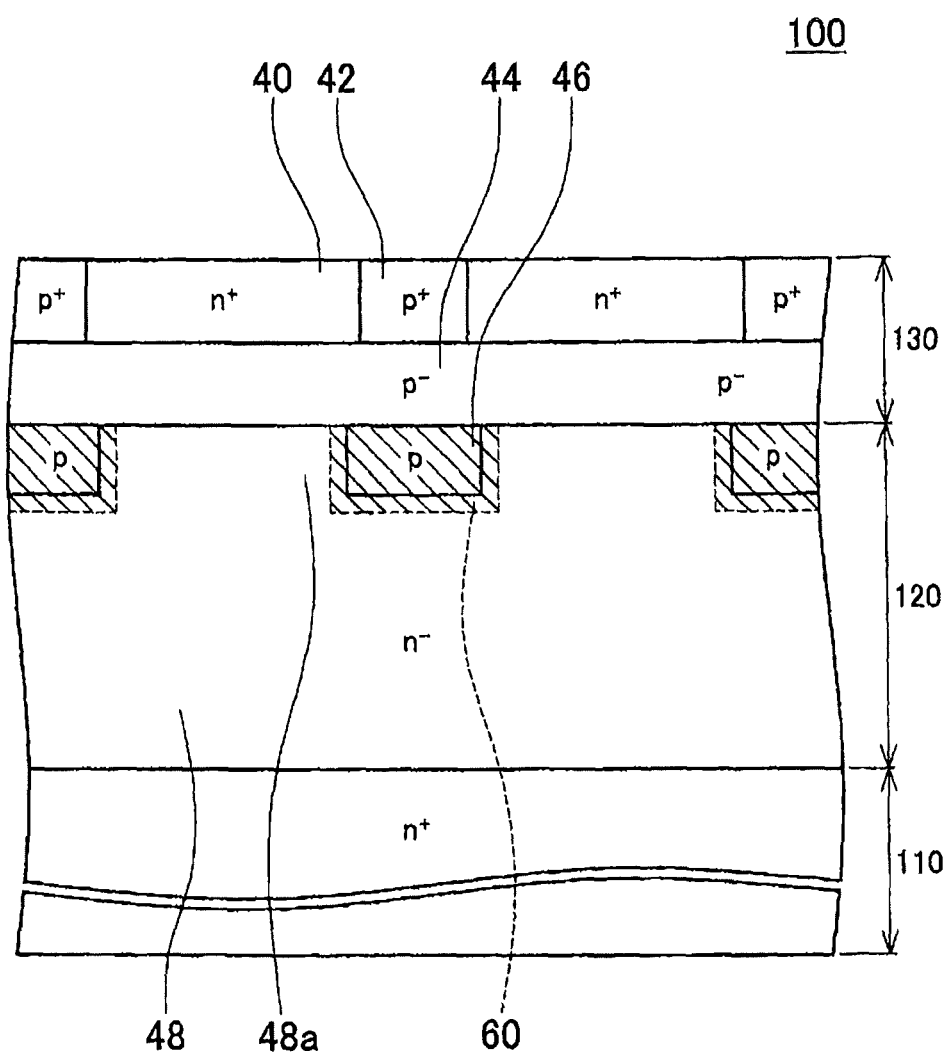
FIG. 8 is a longitudinal sectional view of the semiconductor substrate after execution of Step S16 of FIG. 2.

In Step S16, the semiconductor substrate 100 is thermally treated. With this, the impurities implanted in Steps S6, S8, and S14 are diffused and activated. With this, as shown in FIG. 8, the source regions 40, the contact regions 42, and the deep regions 46 are formed in the semiconductor substrate 100. The region that did not become the source region 40 or the contact region 42 in the p-type epitaxial layer 130 serves as the base region 44. In addition, the region that did not become the deep region 46 in the n-type epitaxial layer 120 serves as the drift region 48.

Note that, in Step S16, the diffusion of boron is suppressed by the high-concentration-carbon containing region 60. With this, the enlargement of the deep region 46 is suppressed. This suppression is considered to be due to the following reason. In general, a large number of vacancies (defects) are present at the C site of an SiC crystal. In the SiC crystal, boron is diffused via the vacancies at the C site. Therefore, the diffusion length of boron in the SiC crystal is generally long. In contrast to this, in the semiconductor substrate 100 at the time of execution of Step S16, the high-concentration-carbon containing region 60 is formed by implanting carbon. The implanted carbon enters into the vacancies at the C site so that the number of vacancies at the C site decreases in the high-concentration-carbon containing region 60. As a result, it is assumed that the diffusion of boron is suppressed in the high-concentration-carbon containing region 60. In the semiconductor substrate 100, the entire region where boron is implanted is included in the high-concentration-carbon containing region 60, and hence the diffusion of boron is suppressed. Consequently, it is possible to form the extremely small deep region 46.

In Step S18, by the following processes, the gate electrode 24 is formed. First, the trench 20 is formed in the upper surface of the semiconductor substrate 100 by dry etching. Next, silicon oxide (boron phosphorus silicate glass (BPSG), non-doped-silicate-glass (NSG), low temperature oxide (LTO), or the like) is formed on the surface of the semiconductor substrate 100 by chemical vapor deposition (CVD). With this, silicon oxide is filled in the trench 20. Subsequently, grown silicon oxide is etched. At this point, silicon oxide having a thickness of about 1 μm is left at the bottom portion of the trench 20 (the gate insulating film below the gate electrode 24 of FIG. 1). Then, a silicon oxide film having a thickness of about 100 nm is formed on the side surface of the trench 20 by sacrificial oxidation or CVD. The gate insulating film 22 of FIG. 1 is constituted by silicon oxide at the bottom portion of the trench 20 and the silicon oxide film on the side surface of the trench 20. Next, the gate electrode 24 is formed by forming polysilicon in the trench 20. Subsequently, the interlayer insulating film 26 is formed by sacrificial oxidation or CVD.

In Step S20, the source electrode 30 is formed by sputtering or the like. With this, the structure of the MOSFET 10 on its upper surface side shown in FIG. 1 is completed.

In Step S22, by the following processes, the structure of the MOSFET 10 on its lower surface side is formed. First, the thickness of the semiconductor substrate 100 is reduced by polishing the lower surface of the semiconductor substrate 100. Next, the drain electrode 32 is formed by sputtering or the like. With this, the MOSFET 10 shown in FIG. 1 is completed.

Thus, according to the manufacturing method, it is possible to form the extremely small deep region 46. Consequently, it is possible to manufacture the smaller MOSFET 10.

In addition, in the manufacturing method, since the entire region where boron is implanted is surrounded by the high-concentration-carbon containing region 60, it is easy to control the shape of the deep region 46. Consequently, it is possible to prevent variations in characteristics between the MOSFETS 10 at the time of mass production of the MOSFET 10.

Further, in the above manufacturing method, ion implantation is performed by using the same mask in Step S6 and Step S8. Since it is possible to perform the ion implantation on two regions by using the same mask, according to the manufacturing method, it is possible to efficiently manufacture the MOSFET 10.

Furthermore, in the above manufacturing method, after the opening 142 of the mask 140 is enlarged in Step S10, the ion implantation of carbon in Step S12 is performed. Since it is possible to perform the ion implantation of carbon without newly producing the mask, according to the manufacturing method, it is possible to efficiently manufacture the MOSFET 10.

Next, the MOSFETs 10 according to other embodiments will be described. In the description of the MOSFETs 10 according to other embodiments, a portion having the same function as that of the MOSFET 10 of the first embodiment will be designated by the same reference numeral as in the first embodiment, and the same description as that of the MOSFET 10 of the first embodiment will be omitted.

Figure 9:
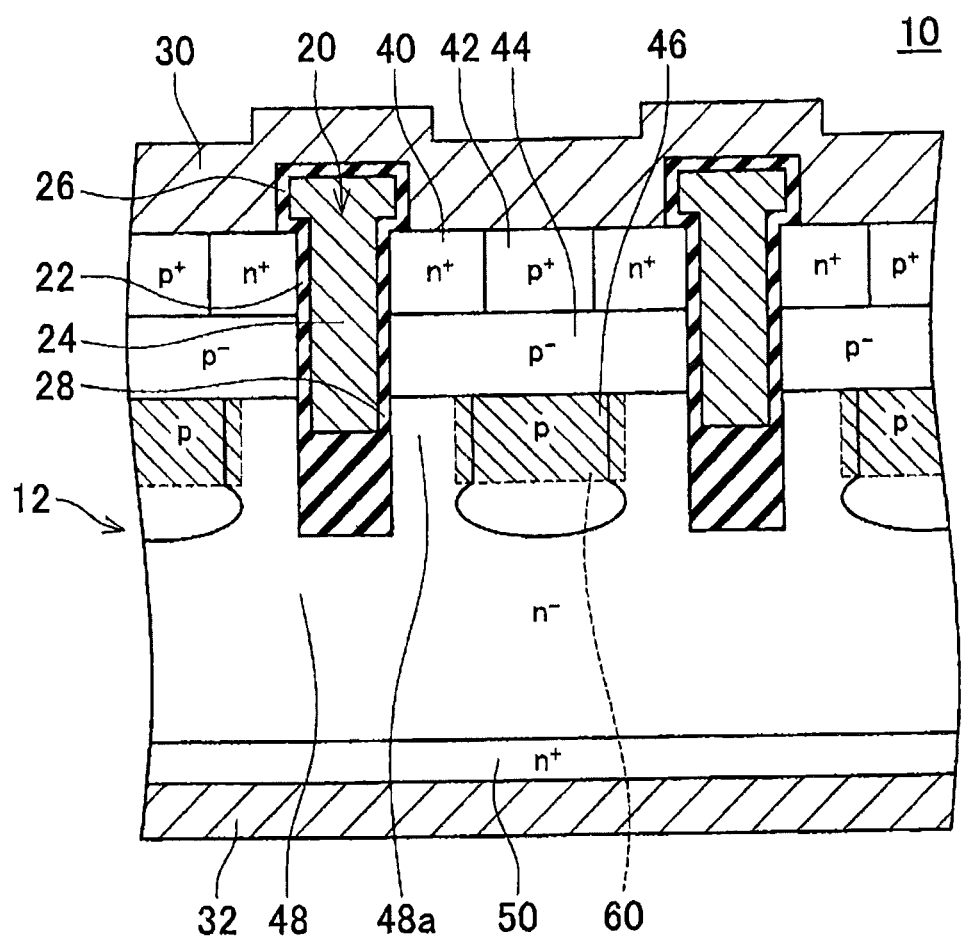
FIG. 9 is a longitudinal sectional view of the MOSFET of a second embodiment.

The MOSFET 10 of a second embodiment has a cross-sectional structure shown in FIG. 9. As shown in the drawing, in the MOSFET 10 of the second embodiment, the deep region 46 is extended to a position below the high-concentration-carbon containing region 60. In a case where the deep region 46 is extended to the lower position in this manner, the electric field applied to the gate insulating film 22 in the region 28 is further relaxed when the MOSFET 10 is turned OFF. In addition, even in a case where the structure is adopted in which the deep region 46 is extended to the lower position, if the width of the deep region 46 in the lateral direction is reduced, it is possible to reduce the size of the MOSFET 10.

Figure 10:
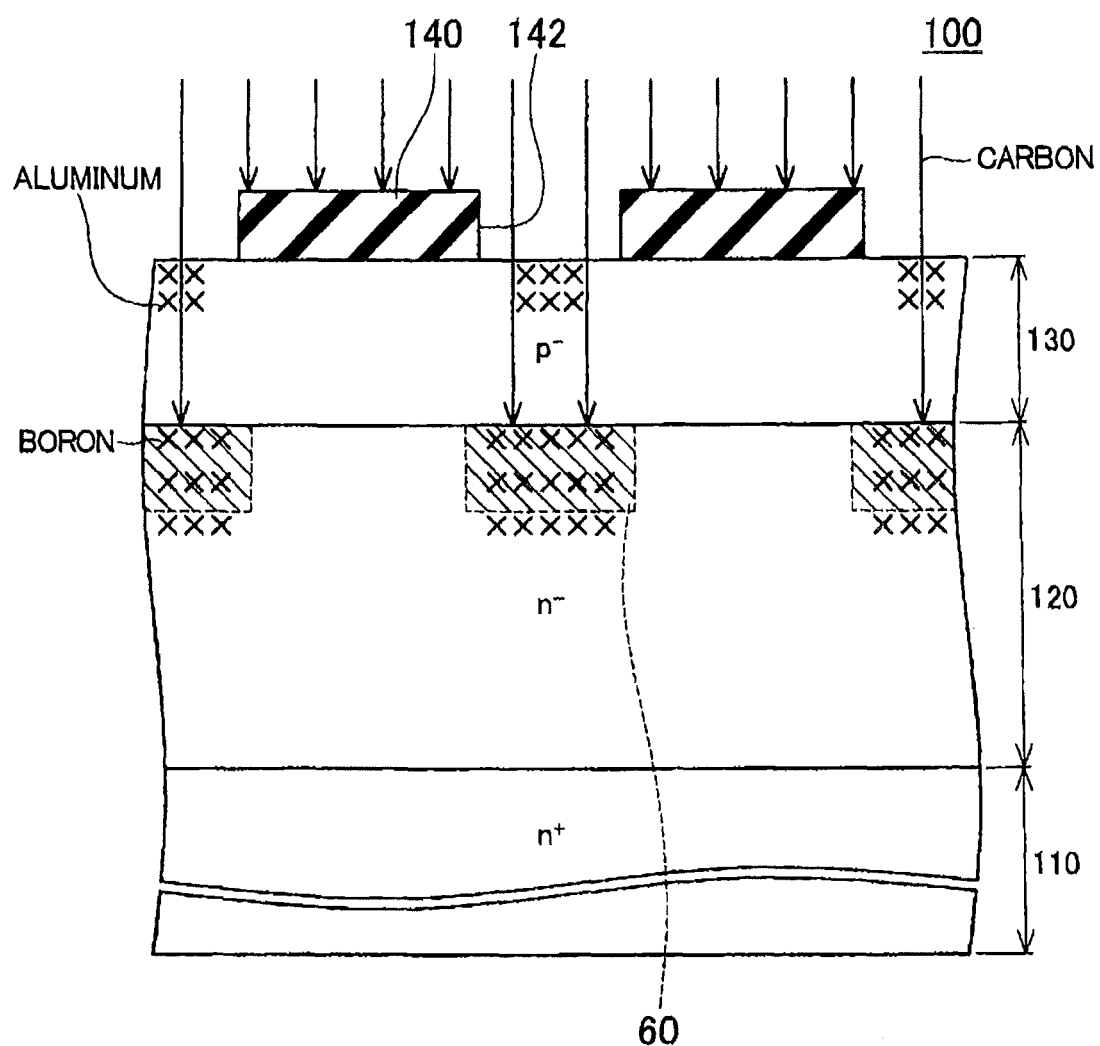
FIG. 10 is an explanatory view of carbon implantation of the second embodiment.

Next, a manufacturing method of the MOSFET 10 of the second embodiment will be described. The MOSFET 10 of the second embodiment is also manufactured according to the flowchart of FIG. 2. However, in the manufacturing method of the second embodiment, at least one of the implantation depth of boron in Step S6 and the implantation depth of carbon in Step S12 is different from that in the manufacturing method of the first embodiment. In the manufacturing method of the second embodiment, as shown in FIG. 10, after the end of Step S12, a part of boron is positioned below the high-concentration-carbon containing region 60. In the subsequent thermal treatment in Step S16, the diffusion of boron is suppressed in the high-concentration-carbon containing region 60, but the diffusion of boron positioned below the high-concentration-carbon containing region 60 is not suppressed. Accordingly, as shown in FIG. 9, it is possible to form the deep region 46 that is extended to the lower position.

Thus, according to the manufacturing method of the second embodiment, it is possible to manufacture the MOSFET 10 that has a higher effect of relaxing the electric field. Note that, in the manufacturing method of the second embodiment, since the diffusion of boron is partially allowed, it becomes rather difficult to control the region where the deep region 46 is formed. In a case where priority is placed on the prevention of variations in characteristics, the method in which the diffusion of the entire implanted boron is suppressed as in the first embodiment is more suitable.

Figure 11:
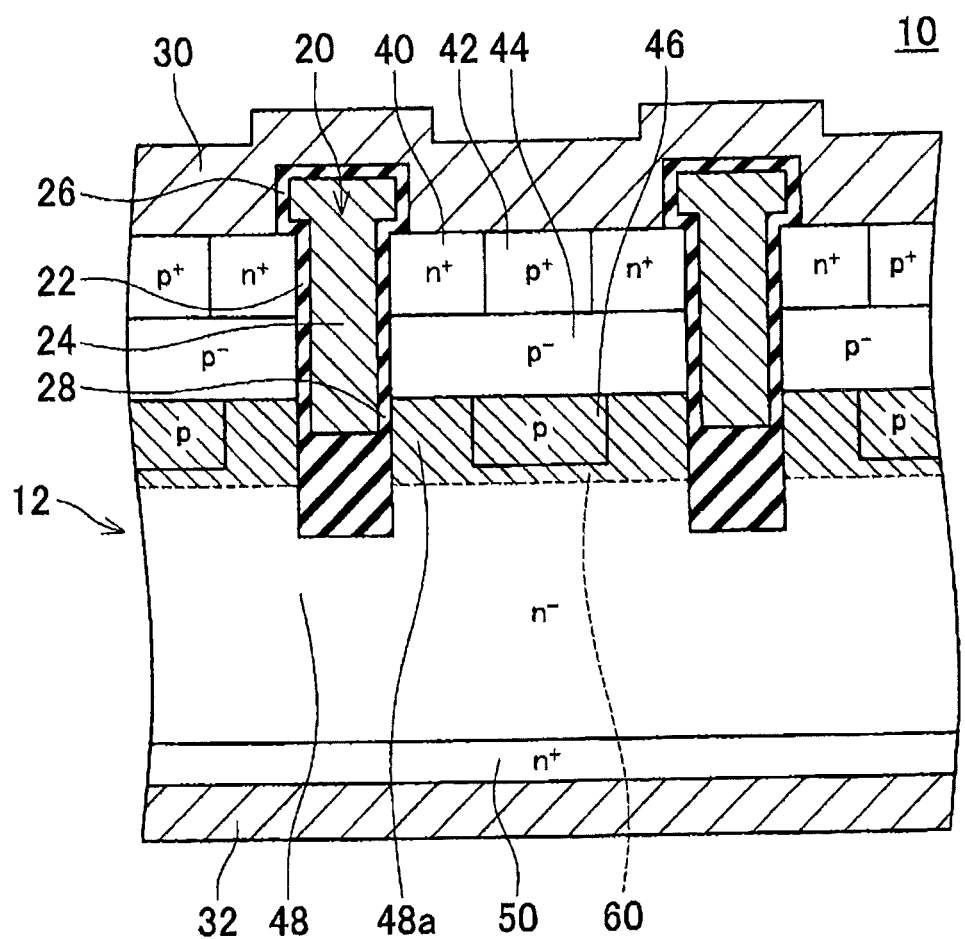
FIG. 11 is a longitudinal sectional view of the MOSFET of a third embodiment.

The MOSFET 10 of a third embodiment has a cross-sectional structure shown in FIG. 11. As shown in the drawing, in the MOSFET 10 of the third embodiment, the deep region 46 is extended to the separating drift region 48a. Even when the deep region 46 is extended to the separating drift region 48a in this manner, the MOSFET 10 operates similarly to the MOSFET 10 of the first embodiment.

Figure 12:
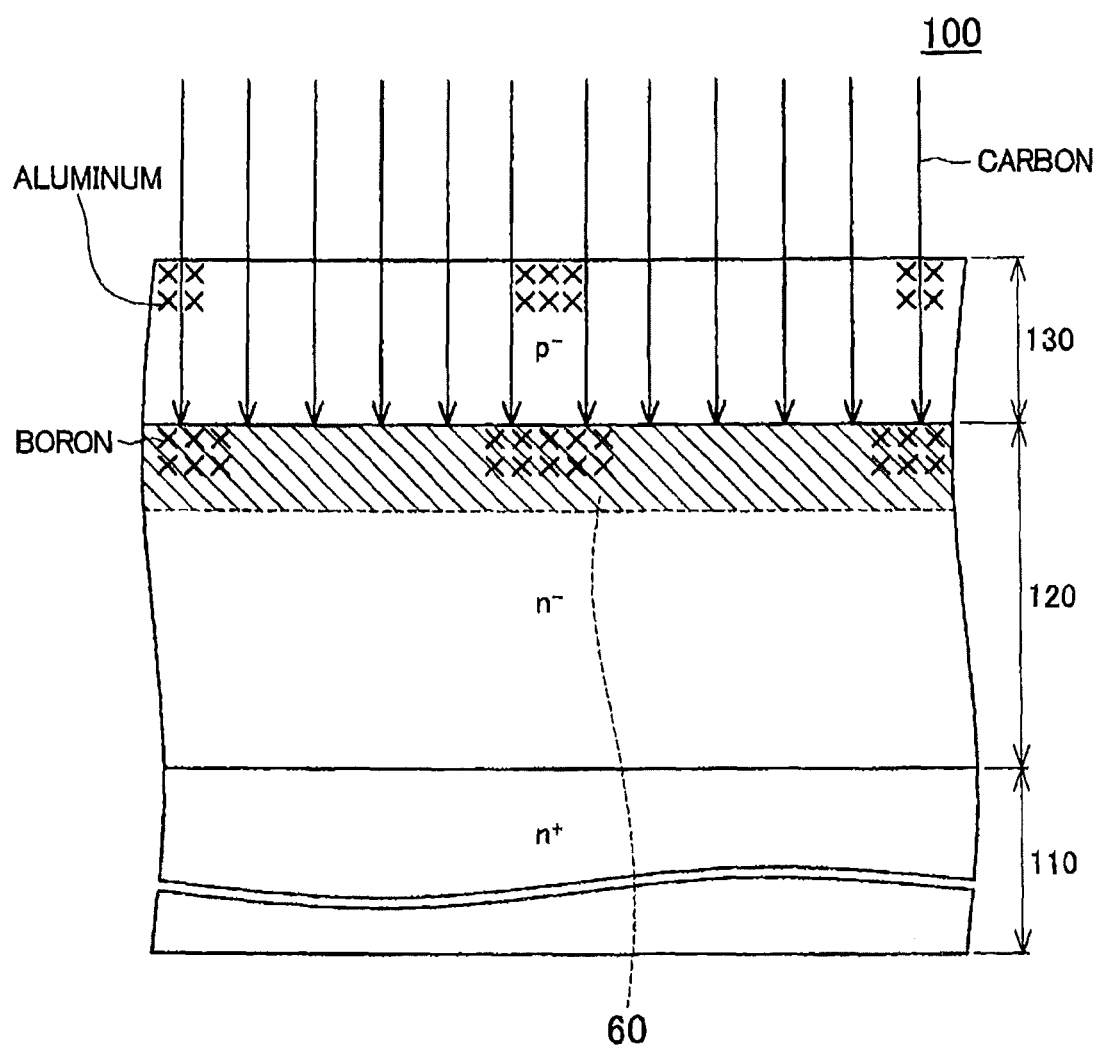
FIG. 12 is an explanatory view of carbon implantation of the third embodiment.

Next, a manufacturing method of the MOSFET 10 of the third embodiment will be described. The MOSFET 10 of the third embodiment is also manufactured according to the flowchart of FIG. 2. However, in the manufacturing method of the third embodiment, the mask is not used in Step S12. That is, in Step S10, the mask 140 is completely removed by etching. Subsequently, in Step S12, carbon is implanted into the semiconductor substrate 100 in a state where no mask is present. As a result, as shown in FIG. 12, the high-concentration-carbon containing region 60 is formed over a region wide in the lateral direction. Thereafter, the individual steps are executed similarly to the first embodiment, and the MOSFET 10 shown in FIG. 11 is thereby completed. Even when the high-concentration-carbon containing region 60 is formed in this manner, it is possible to suppress the diffusion of boron to make the deep region 46 extremely small.

Figure 13:
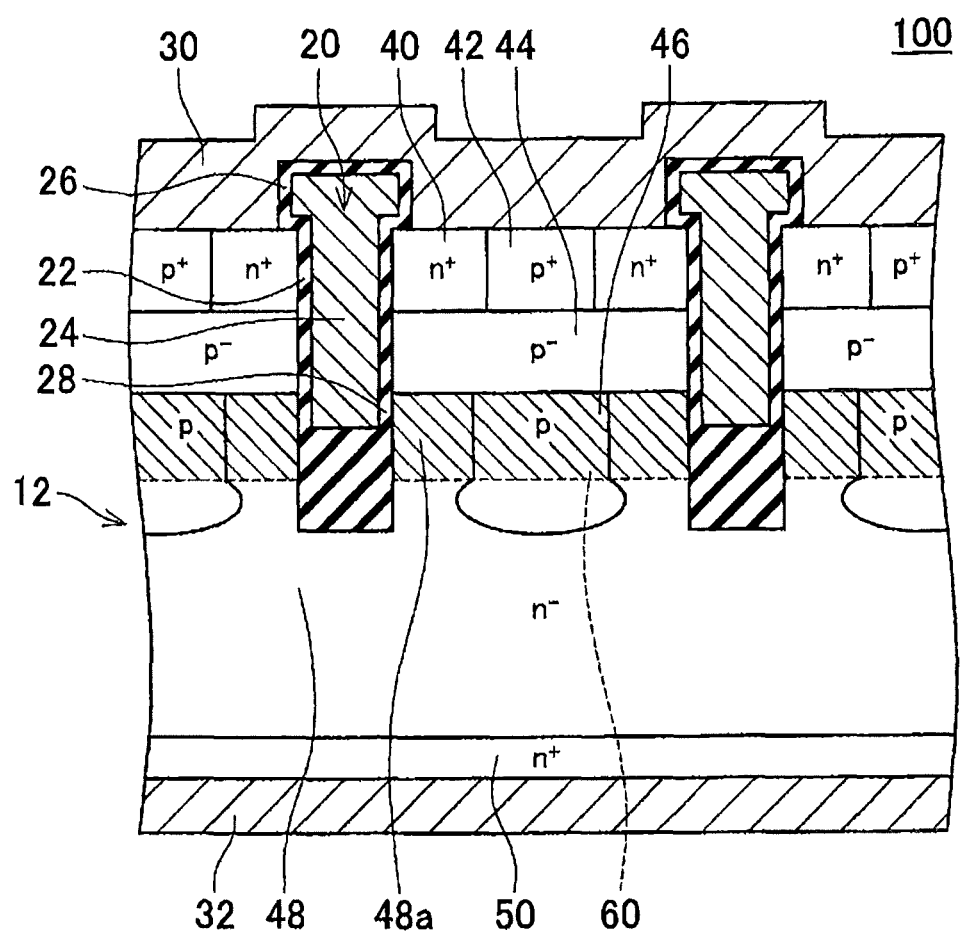
FIG. 13 is a longitudinal sectional view of the MOSFET of a first modification of the third embodiment.

Note that, in the manufacturing method of the third embodiment as well, by positioning a part of boron below the high-concentration-carbon containing region 60, the deep region 46 that is extended to the position below the high-concentration-carbon containing region 60 may also be formed, as shown in FIG. 13.

Figure 14:
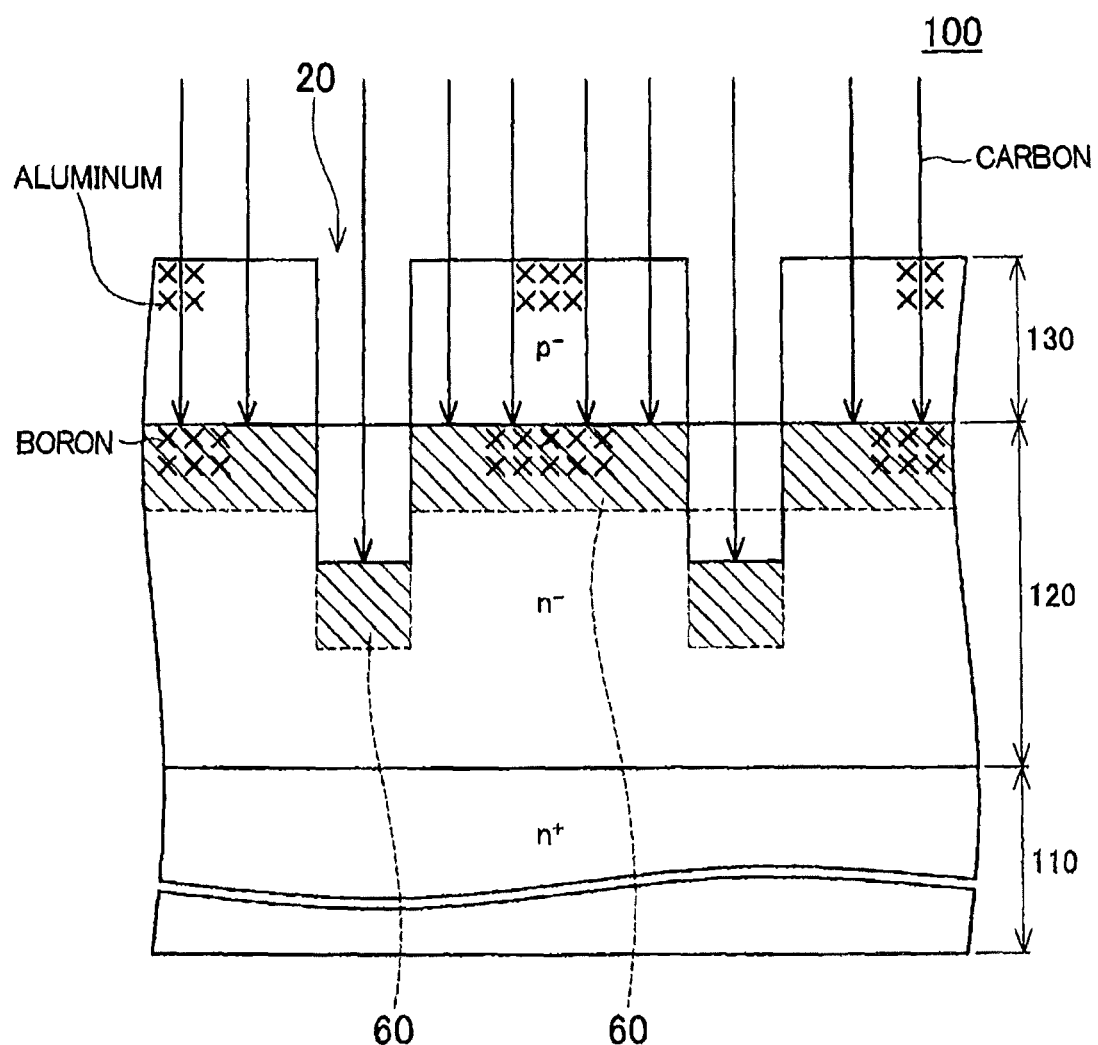
FIG. 14 is a longitudinal sectional view of carbon implantation of a second modification of the third embodiment.

Note that, in the above manufacturing method of the third embodiment, the trench 20 may also be formed in the semiconductor substrate 100 before execution of Step S6. In this case, in Step S6, the high-concentration-carbon containing region 60 is formed also at the bottom portion of the trench 20, as shown in FIG. 14. Even with the above structure, the MOSFET 10 can properly operate.

Figure 15:
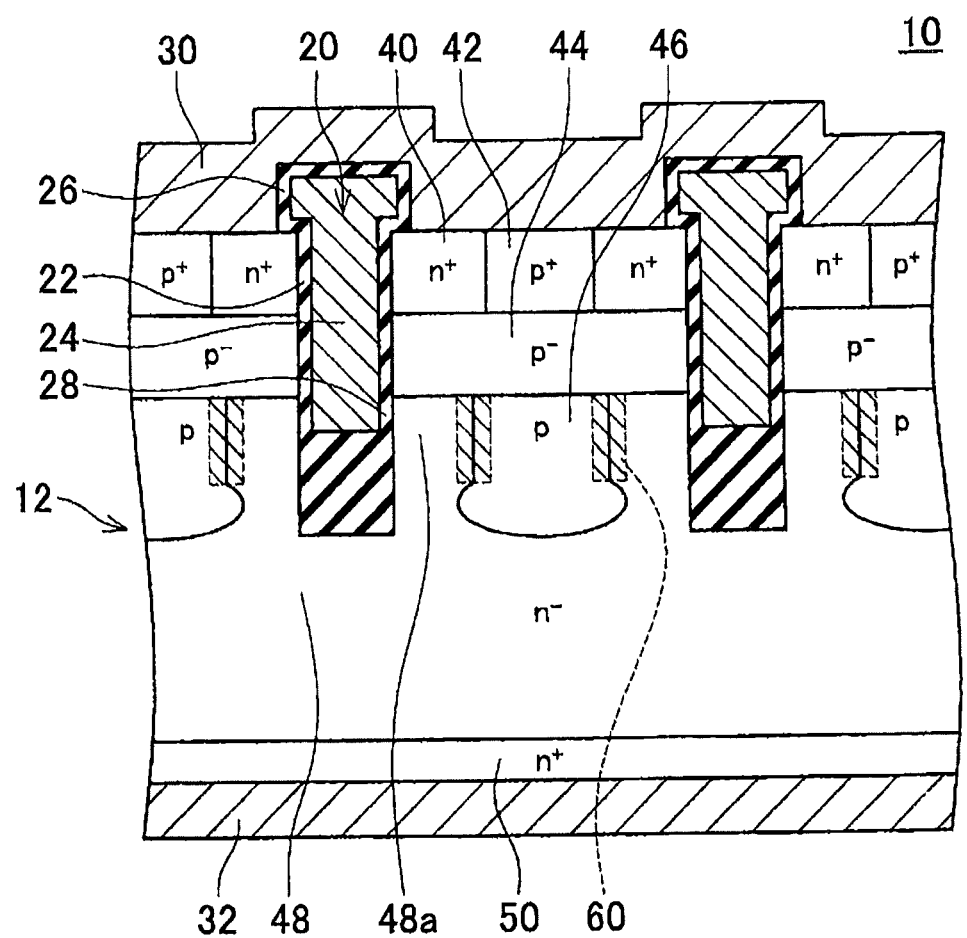
FIG. 15 is a longitudinal sectional view of the MOSFET of a fourth embodiment.

The MOSFET 10 of a fourth embodiment has a cross-sectional structure shown in FIG. 15. As shown in the drawing, in the MOSFET of the fourth embodiment, the high-concentration-carbon containing region 60 is formed only in a region in contact with the deep region 46 in the lateral direction. In addition, the deep region 46 is extended to the position below the high-concentration-carbon containing region 60. In this MOSFET, since the deep region 46 is extended to the lower position, it is possible to further relax the electric field applied to the gate insulating film 22 in the region 28.

Figure 16:
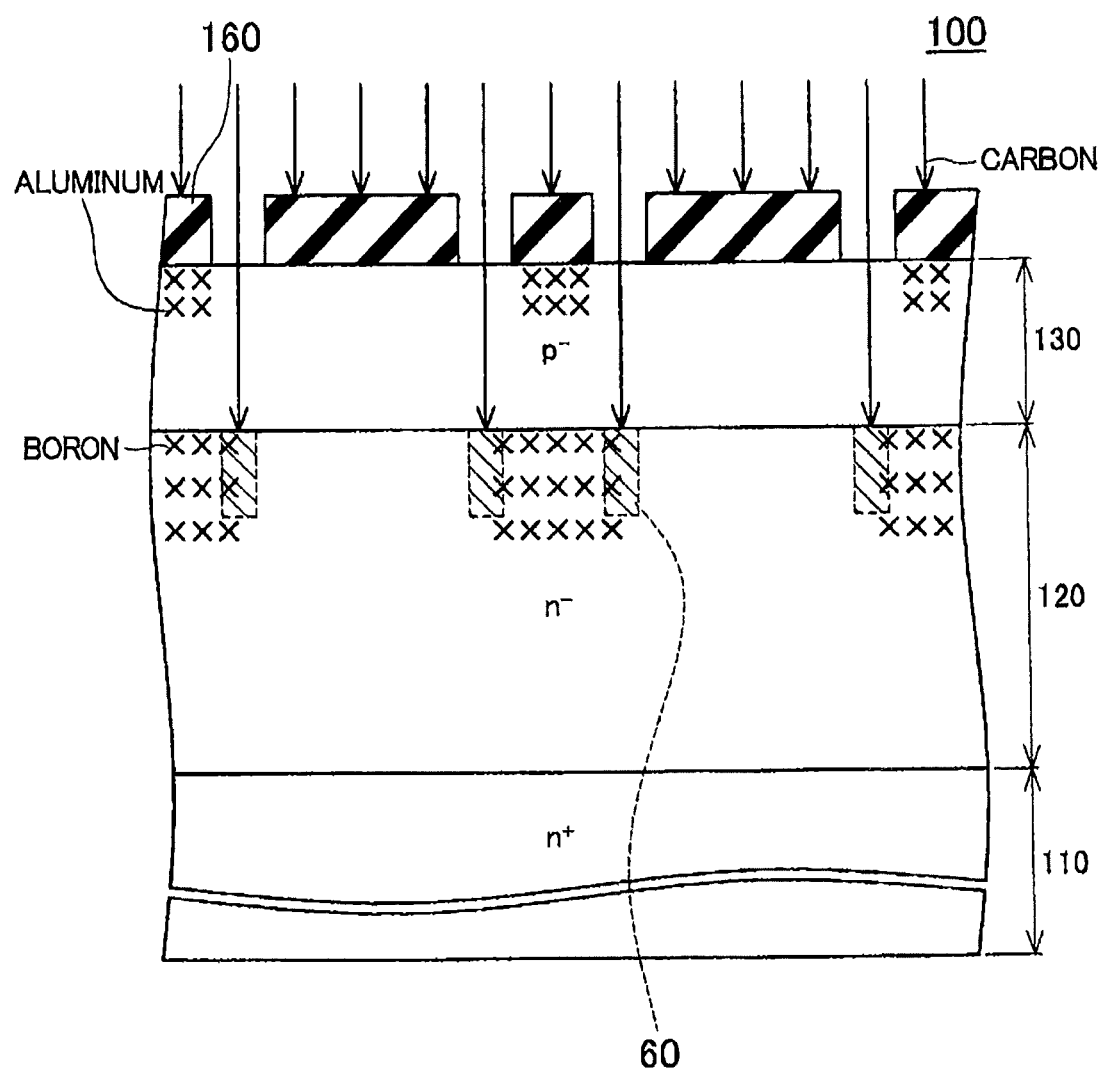
FIG. 16 is an explanatory view of carbon implantation of the fourth embodiment.

Next, a manufacturing method of the MOSFET of the fourth embodiment will be described. The MOSFET of the fourth embodiment is also manufactured according to the flowchart of FIG. 2. However, in the manufacturing method of the fourth embodiment, the mask is newly formed in Step S10. That is, in Step S10, the mask 140 is completely removed by etching. Further, as shown in FIG. 16, a new mask 160 is formed on the upper surface of the semiconductor substrate 100. In Step S12, as shown in FIG. 16, carbon is implanted into the semiconductor substrate 100 through the new mask 160. With this, the high-concentration-carbon containing region 60 is formed only in a region adjacent to the region where boron is implanted in the lateral direction. Thereafter, the individual steps are executed similarly to the first embodiment, and the MOSFET 10 shown in FIG. 15 is thereby completed. Thus, when the high-concentration-carbon containing region 60 is formed laterally, to the region where boron is implanted in Step S12, it is possible to suppress the diffusion of boron in the lateral direction and make the deep region 46 extremely small. That is, the high-concentration-carbon containing region 60 may appropriately be formed in at least a part of the portion of the separating drift region 48a between the deep region 46 and the gate insulating film 22 that is in contact with the deep region 46.

Figure 17:
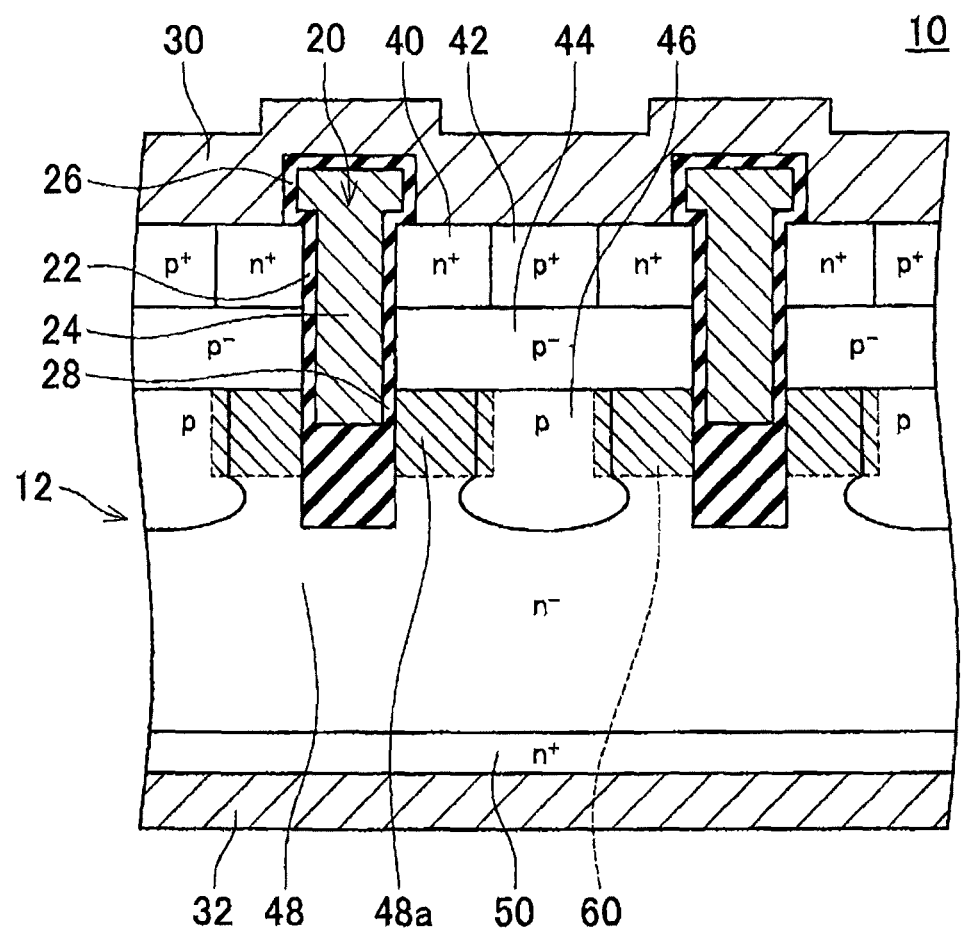
FIG. 17 is a longitudinal sectional view of the MOSFET of a fifth embodiment.

The MOSFET 10 of a fifth embodiment has a cross-sectional structure shown in FIG. 17. As shown in the drawing, in the MOSFET 10 of the fifth embodiment, the high-concentration-carbon containing region 60 is formed in substantially the entire separating drift region 48a, and most of the deep region 46 is formed outside the high-concentration-carbon containing region 60. In addition, the deep region 46 is extended to the position below the high-concentration-carbon containing region 60. In this MOSFET 10, since the deep region 46 is extended to the lower position, it is possible to further relax the electric field applied to the gate insulating film 22 in the region 28.

Figure 18:
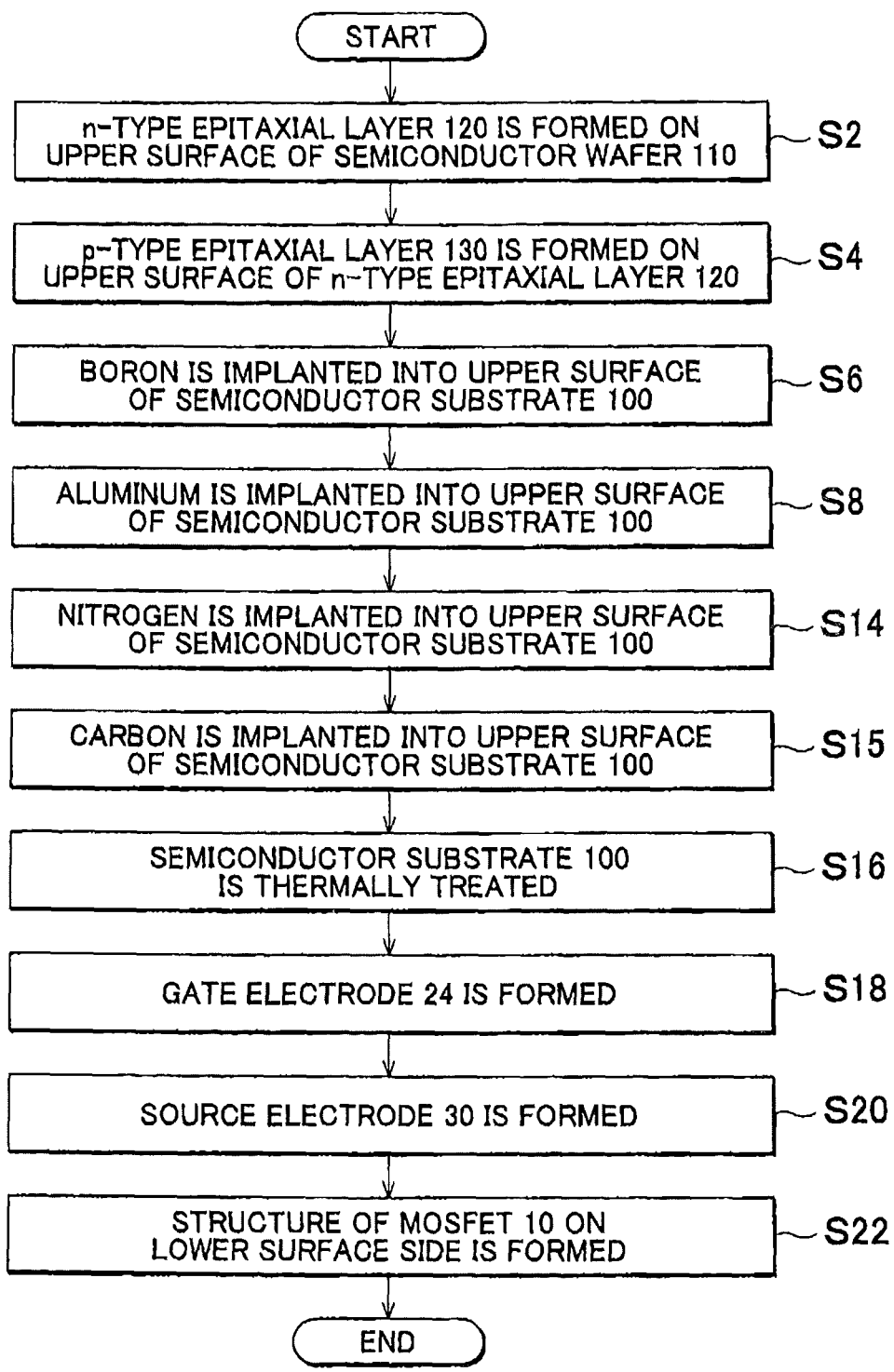
FIG. 18 is a flowchart of a manufacturing method of the fifth embodiment.
Figure 19:
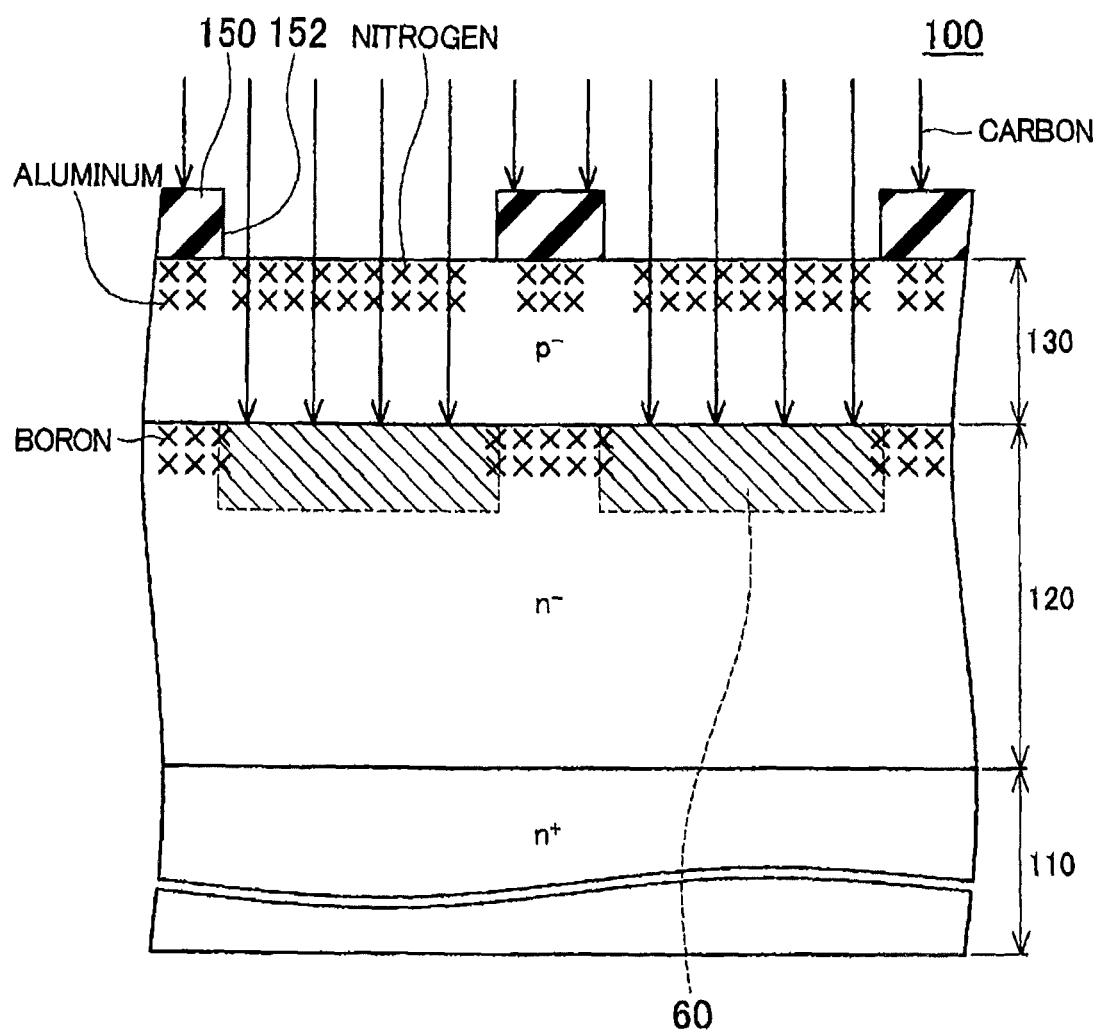
FIG. 19 is an explanatory view of carbon implantation of the fifth embodiment.

Next, a manufacturing method of the MOSFET 10 of the fifth embodiment will be described. The MOSFET 10 of the fifth embodiment is manufactured according to a flowchart of FIG. 18. As shown in the drawing, in the manufacturing method, Steps S2 to S8 are executed in the same manner as in the manufacturing method of the first embodiment. Subsequently, Step S14 is executed (Steps S10 and S12 of FIG. 2 are not executed). Step S14 is executed substantially in the same manner as in the first embodiment. However, after the end of Step S14, the mask 150 (see FIG. 7) is not removed. Then, in Step S15, as shown in FIG. 19, carbon is implanted into the upper surface of the semiconductor substrate 100 through the mask 150 used in Step S14. With this, the high-concentration-carbon containing region 60 is formed. Thereafter, Steps S16 to S22 are executed in the same manner as in the first embodiment, and the MOSFET 10 shown in FIG. 17 is thereby completed. Thus, even when the high-concentration-carbon containing region 60 is formed in the entire separating drift region 48a, it is possible to suppress the diffusion of boron toward the gate insulating film 22.

In addition, since the same mask can be used in the implantation of carbon and the implantation of nitrogen in the manufacturing method of the fifth embodiment, it is possible to efficiently manufacture the MOSFET 10.

The MOSFET 10 of a sixth embodiment has the cross-sectional structure shown in FIG. 11 similarly to the MOSFET 10 of the third embodiment.

Figure 20:
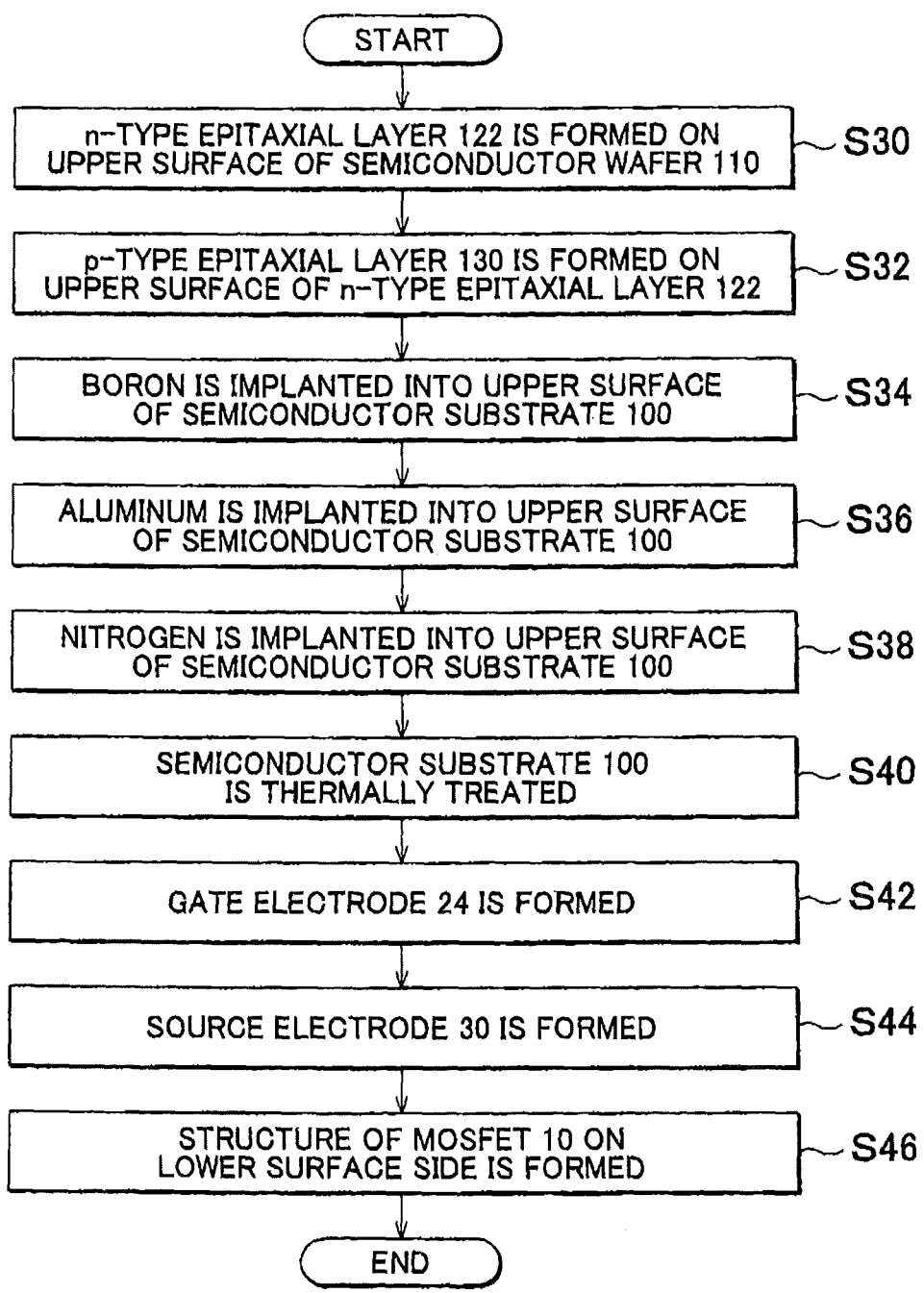
FIG. 20 is a flowchart of a manufacturing method of a sixth embodiment.
Figure 21:
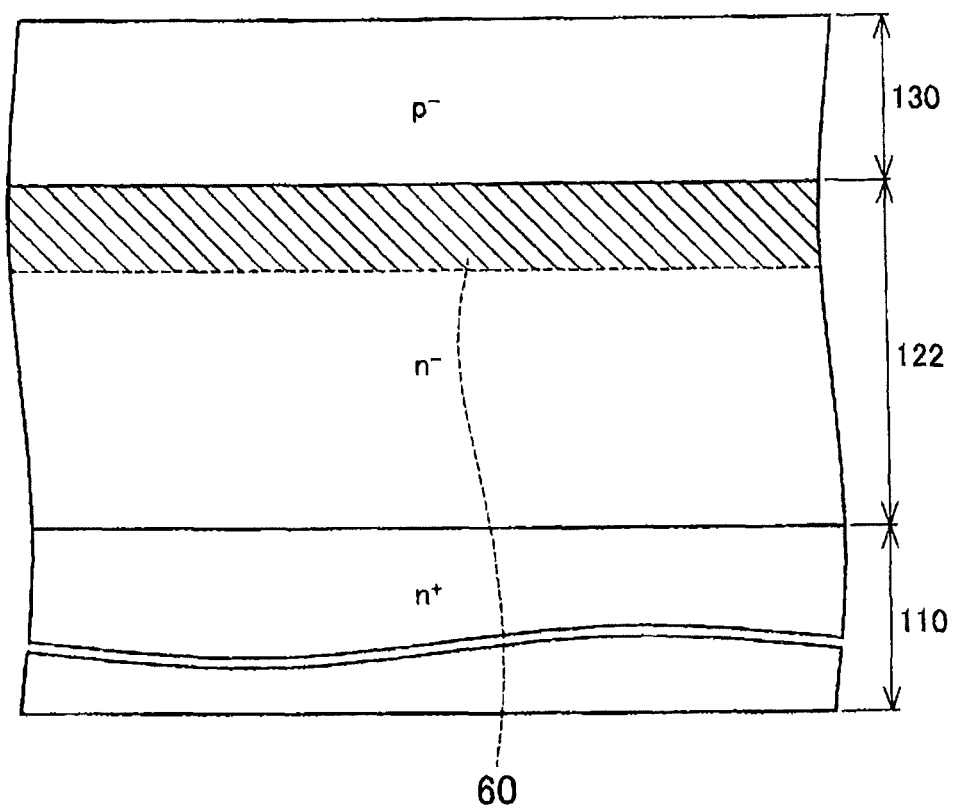
FIG. 21 is a longitudinal sectional view of a semiconductor wafer of the sixth embodiment.

Next, a manufacturing method of the MOSFET 10 of the sixth embodiment will be described. The MOSFET 10 of the sixth embodiment is manufactured according to a flowchart of FIG. 20. In Step S30, as shown in FIG. 21, an n-type epitaxial layer 122 is formed on the upper surface of the semiconductor wafer 110. At this point, by changing the ratio between carbon and silicon in a material gas during the growth of the n-type epitaxial layer 122, the high-concentration-carbon containing region 60 is formed in the upper surface portion of the n-type epitaxial layer 122. In subsequent Step S32, the p-type epitaxial layer 130 shown in FIG. 21 is grown on the upper surface of the n-type epitaxial layer 122. With this, as shown in FIG. 21, there is obtained a semiconductor substrate 102 including three layers of the semiconductor wafer 110, the n-type epitaxial layer 122, and the p-type epitaxial layer 130.

Figure 22:
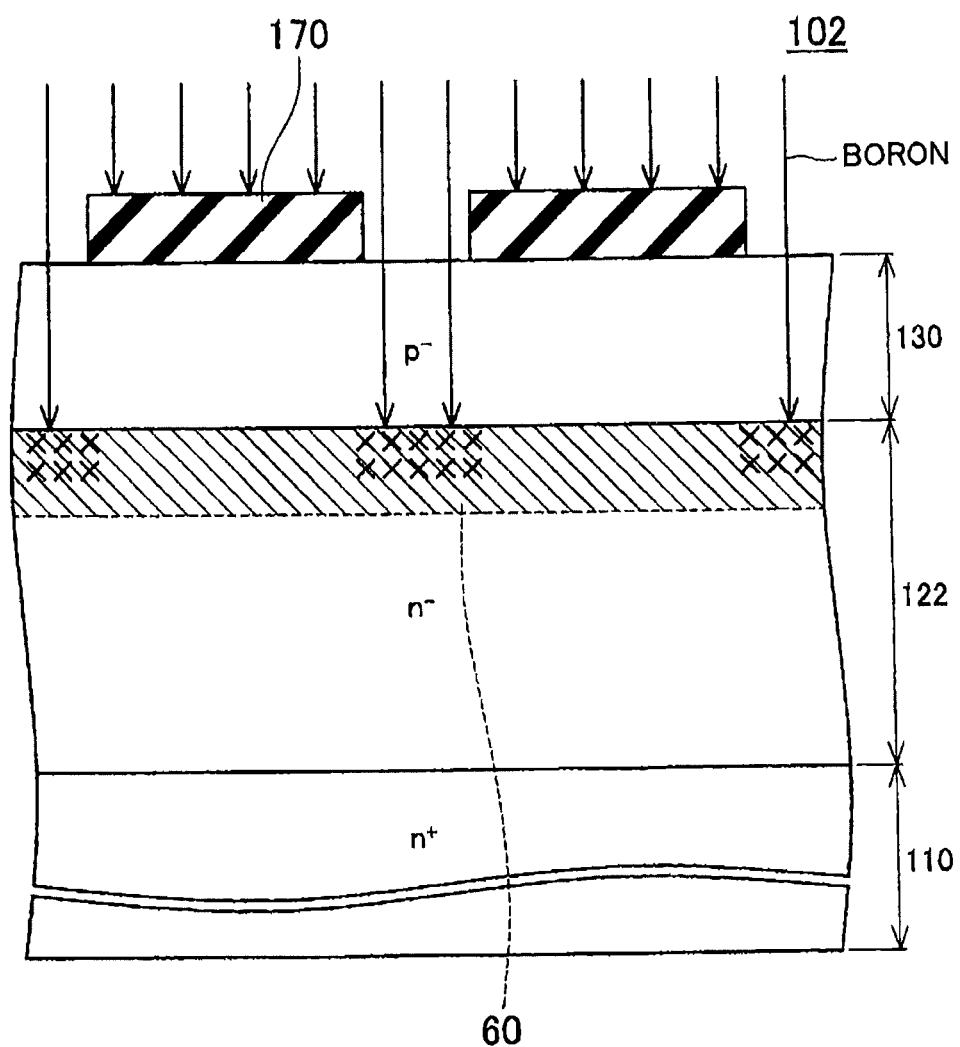
FIG. 22 is an explanatory view of boron implantation of the sixth embodiment.

In Step S34, as shown in FIG. 22, a mask 170 is formed on the upper surface of the semiconductor substrate 102, and boron is applied to the upper surface of the semiconductor substrate 102. With this, boron is implanted into the high-concentration-carbon containing region 60. That is, boron is implanted into the region where the deep region 46 is to be formed.

In Steps S36 and S38, aluminum and nitrogen are implanted into the semiconductor substrate 102 in the same manner as in Steps S8 and S14 of the manufacturing method of the first embodiment (FIG. 2). Subsequent Steps S40 to S46 are executed in the same manner as in Steps S16 to S22 of FIG. 2. With this, the MOSFET 10 shown in FIG. 11 is completed. During the thermal treatment of Step S40, the diffusion of boron is suppressed by the high-concentration-carbon containing region 60. Consequently, with this manufacturing method as well, it is possible to form the extremely small deep region 46.

Thus, the high-concentration-carbon containing region 60 may also be formed by epitaxial growth. Also by the high-concentration-carbon containing region 60 formed in this manner, it is possible to suppress the diffusion of boron.

Figure 23:
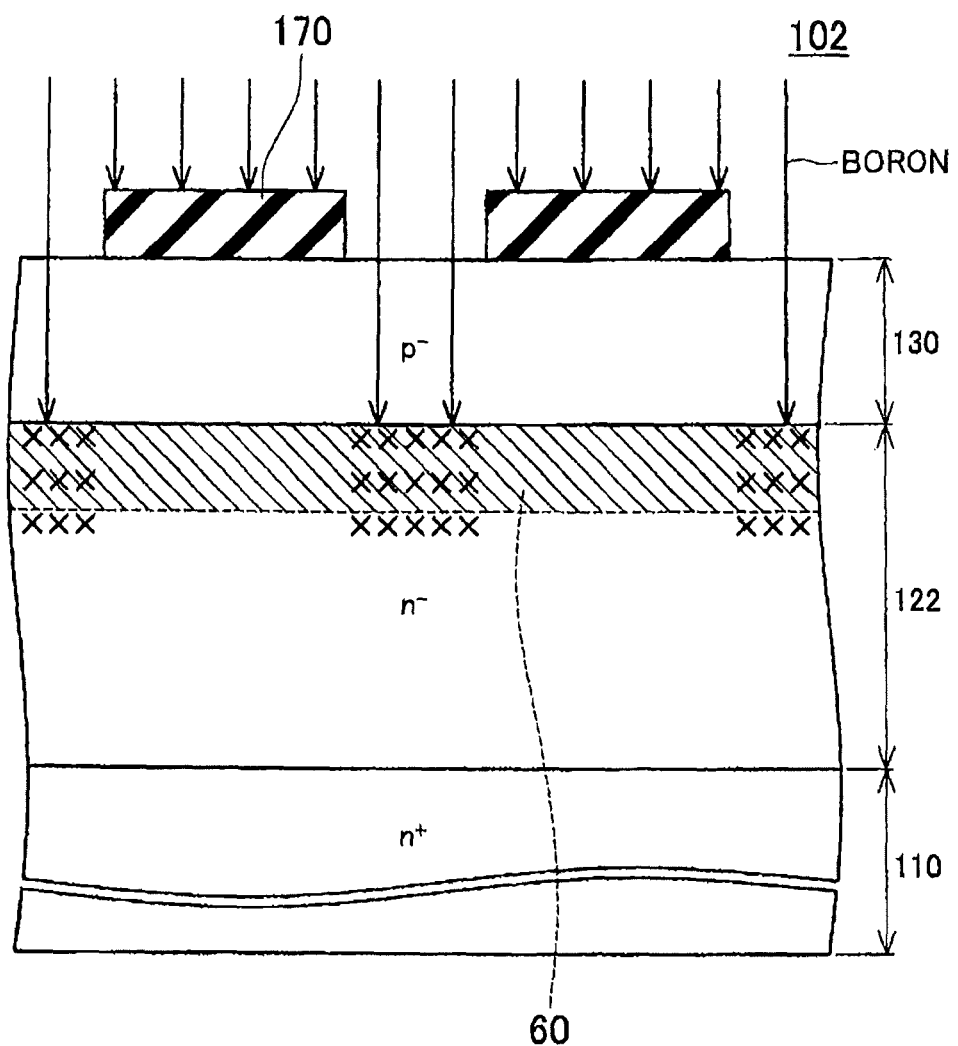
FIG. 23 is an explanatory view of boron implantation of a modification of the sixth embodiment.

In the implantation of boron in Step S34 of the manufacturing method of the sixth embodiment, as shown in FIG. 23, a part of boron may also be implanted to the position below the high-concentration-carbon containing region 60. When boron is implanted in the above manner, it is possible to manufacture the MOSFET 10 having the deep region 46 extended to the position below the high-concentration-carbon containing region 60, as shown in FIG. 13.

Note that, although the MOSFET has been described in each of the above first to sixth embodiments, the technology disclosed in this specification can also be used in other switching elements having the trench gate electrode (e.g., an insulated gate bipolar transistor (IGBT) and the like).

In addition, although the execution of the individual steps according to the specific order has been described in each embodiment described above, the order of execution of the individual steps can appropriately be changed. For example, the step of forming the gate electrode may also be executed before the individual steps of implanting the impurities. Further, the individual steps of implanting the impurities may also be executed in an order different from the above order.

Specific examples of the invention have been described in detail above, but these are no more than examples and do not limit the scope of the claims. The technology described in the claims includes various modifications and alterations of the specific examples described above. Furthermore, the technical elements described in the specification or the drawings display technical utility either independently or in various combinations, and are not limited to the combinations stated in the claims in the application. Moreover, the technology described as examples in the specification or the drawings achieves a plurality of objects simultaneously, and has technical utility by achieving any one of these objects.

What is claimed is:

1. A switching element comprising:
a semiconductor substrate;
a gate insulating film covering an inner surface of a trench formed in an upper surface of the semiconductor substrate;
a gate electrode disposed in an internal portion of the trench;
an n-type first semiconductor region present in the semiconductor substrate and in contact with the gate insulating film on a side surface of the trench;
a p-type second semiconductor region present in the semiconductor substrate and in contact with the gate insulating film on the side surface of the trench and formed below the first semiconductor region;
an n-type third semiconductor region present in the semiconductor substrate and in contact with the gate insulating film on the side surface of the trench and formed below the second semiconductor region;
a p-type fourth semiconductor region present in the semiconductor substrate and in contact with the second semiconductor region on a lower side of the second semiconductor region and opposing the gate insulating film via the third semiconductor region, this fourth semiconductor region containing boron; and
a fifth semiconductor region present below the third semiconductor region in the semiconductor substrate and formed to be exposed on a lower surface of the semiconductor substrate; wherein
at least a part of the third semiconductor region positioned between the fourth semiconductor region and the gate insulating film has a carbon concentration higher than that of the fifth semiconductor region.

2. The switching element according to claim 1, wherein
at least a part of the third semiconductor region positioned below the fourth semiconductor region has a carbon concentration is higher than that of the fifth semiconductor region.

3. A manufacturing method of a switching element having a semiconductor substrate, a gate insulating film covering an inner surface of a trench formed in an upper surface of the semiconductor substrate, a gate electrode disposed in an internal portion of the trench, an n-type first semiconductor region present in the semiconductor substrate and in contact with the gate insulating film on a side surface of the trench, a p-type second semiconductor region in contact with the gate insulating film on the side surface of the trench and formed below the first semiconductor region, an n-type third semiconductor region in contact with the gate insulating film on the side surface of the trench, and formed below the second semiconductor region, a p-type fourth semiconductor region in contact with the second semiconductor region on a tower side of the second semiconductor region and opposing the gate insulating film via the third semiconductor region, this fourth semiconductor region containing boron, and an n-type fifth semiconductor region present below the third semiconductor region and formed to be exposed on a lower surface of the semiconductor substrate, wherein at least a part of the third semiconductor region positioned between the fourth semiconductor region and the gate insulating film is formed to have a carbon concentration higher than that of the fifth semiconductor region, the manufacturing method comprising:
a first step of implanting boron into a region where the fourth semiconductor region is to be formed in the semiconductor substrate;
a second step of forming a region having the carbon concentration higher than that of the semiconductor substrate on or in the semiconductor substrate;
a third step of heating the semiconductor substrate after execution of the first and second steps;
a fourth step of forming the trench;
a fifth step of forming the gate insulating film; and
a sixth step of forming the gate electrode.

4. The manufacturing method of a switching element according to claim 3, wherein
in the second step, carbon is implanted into the semiconductor substrate.

5. The manufacturing method of a switching element according to claim 4, wherein
in the first step, boron is implanted into the semiconductor substrate through a mask having an opening formed on a surface of the semiconductor substrate, a step of enlarging the opening of the mask by etching is executed after execution of the first step, and in the second step, carbon is implanted into the semiconductor substrate by using the mask having the enlarged opening.

6. The manufacturing method of a switching element according to claim 5, wherein
in the second step, at least a part of implanted carbon is implanted into a position below the region where boron is implanted in the first step.

7. The manufacturing method of a switching element according to claim 4, further comprising a seventh step of implanting an n-type impurity into a region where the first semiconductor region is to be formed in the semiconductor substrate by using a mask having an opening formed on a surface of the semiconductor substrate, wherein
in the second step, carbon is implanted into the semiconductor substrate by using a mask identical to the mask used in the seventh step.

8. The manufacturing method of a switching element according to claim 3, wherein
in the second step, a layer having the carbon concentration higher than that of the semiconductor substrate is formed on the semiconductor substrate by epitaxial growth, and boron is implanted into the layer in the first step.

9. The manufacturing method of a switching element according to claim 8, wherein boron is implanted into a position above a lower end of the layer in the first step.

* * * * *